(12) United States Patent
You

(10) Patent No.: US 6,885,064 B2
(45) Date of Patent: Apr. 26, 2005

(54) CONTACT STRUCTURE OF WIRING AND A METHOD FOR MANUFACTURING THE SAME

(75) Inventor: Chun-Gi You, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 249 days.

(21) Appl. No.: 09/755,193

(22) Filed: Jan. 8, 2001

(65) Prior Publication Data

US 2001/0019129 A1 Sep. 6, 2001

(30) Foreign Application Priority Data

| Jan. 7, 2000 | (KR) | .......................................... 2000-712 |
| May 19, 2000 | (KR) | ...................................... 2000-27126 |
| Sep. 28, 2000 | (KR) | ...................................... 2000-57037 |

(51) Int. Cl.$^7$ .................. H01L 27/01; H01L 27/12; H01L 31/0392; H01L 23/48; H01L 23/52
(52) U.S. Cl. .................. 257/347; 257/771; 257/777
(58) Field of Search ............... 257/347, 771, 257/777

(56) References Cited

U.S. PATENT DOCUMENTS

| 5,478,766 | A | * | 12/1995 | Park et al. ................... 438/158 |
| 6,072,450 | A | * | 6/2000 | Yamada et al. ............... 345/76 |
| 6,222,595 | B1 | * | 4/2001 | Zhang et al. .................. 349/38 |
| 6,278,502 | B1 | * | 8/2001 | Colgan et al. ................ 349/38 |
| 6,407,782 | B1 | * | 6/2002 | Kim .......................... 349/106 |
| 2002/0061410 | A1 | * | 5/2002 | Sasaki et al. ............... 428/469 |
| 2002/0130324 | A1 | * | 9/2002 | Song et al. .................... 257/72 |

FOREIGN PATENT DOCUMENTS

| KR | 1998-079255 | 11/1998 |
| KR | 1999-0077818 | 10/1999 |

OTHER PUBLICATIONS

Stanley Wolf Ph.D. and Richard N. Tauber Ph.D. in Silicon Processing for the VLSI Era, vol. 1: Process Technology, Lattice Press, 1986, pp. 191–195.*

* cited by examiner

Primary Examiner—Olik Chaudhuri
Assistant Examiner—William M. Brewster
(74) Attorney, Agent, or Firm—McGuireWoods LLP

(57) ABSTRACT

First, a conductive material made of aluminum-based material is deposited and patterned to form a gate wire including a gate line, a gate pad, and a gate electrode. A gate insulating layer is formed, and a semiconductor layer and an ohmic contact layer are sequentially formed. Next, a conductor layer including a lower layer of Cr and an upper layer of aluminum-based material is deposited and patterned to form a data wire include a data line intersecting the gate line, a source electrode, a drain electrode and a data pad. Then, a passivation layer is deposited and a thermal treatment process using annealing step is executed. At this time, all or part of aluminum oxide ($AlO_x$) layer having a high resistivity, which is formed on the gate wire and/or the data wire during manufacturing process, may be removed. Then, the passivation layer is patterned to form contact holes exposing the drain electrode, the gate pad and the data pad, respectively. Next, IZO is deposited and patterned to form a pixel electrode, a redundant gate pad and a redundant data pad respectively connected to the drain electrode, the gate pad and the data pad, respectively. By removing aluminum oxide ($AlO_x$) layer having a high resistivity, through annealing step, the contact resistance between the metal of aluminum-based material, and IZO may be minimized, because they directly contact each other.

14 Claims, 38 Drawing Sheets

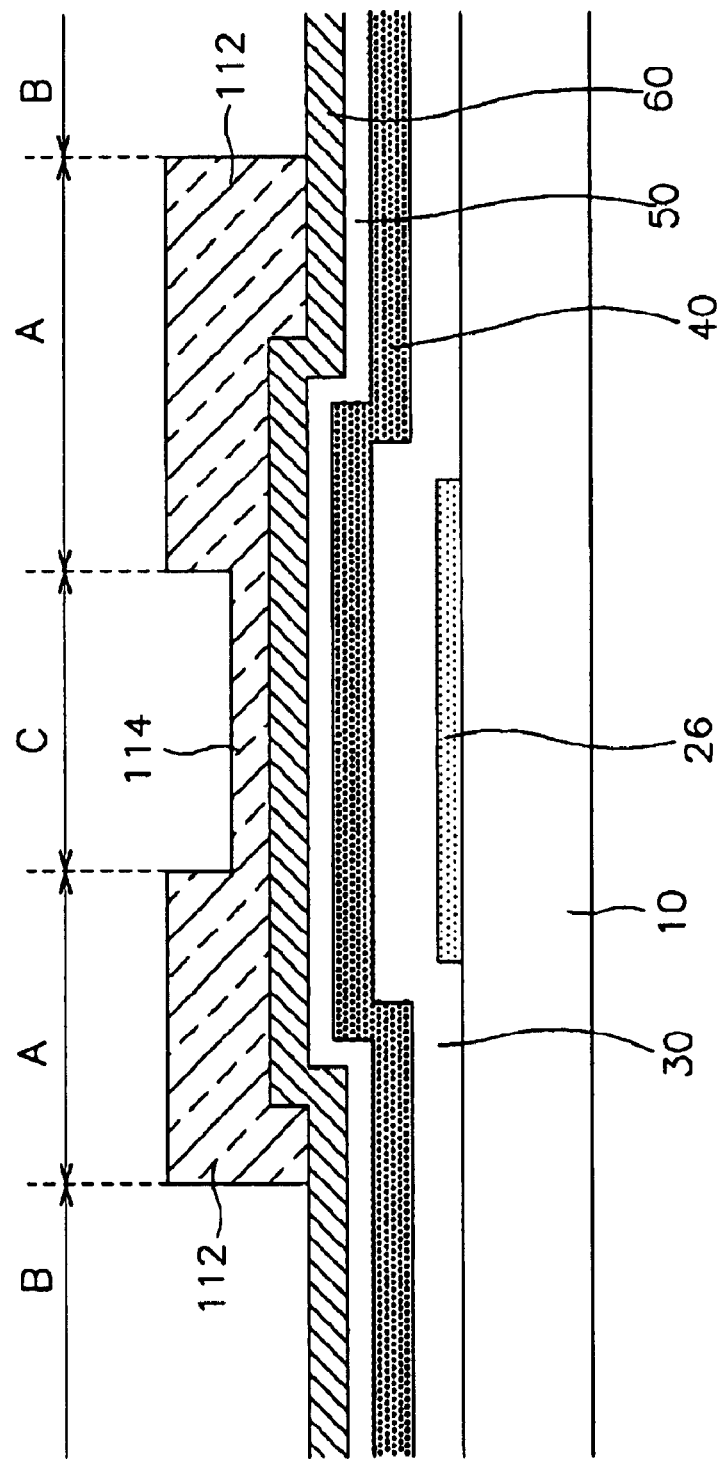

CONTACT STRUCTURE OF WIRING AND A METHOD FOR MANUFACTURING THE SAME

BACKGROUND OF THE INVENTION 1. (a) Field of the Invention

The present invention relates to contact structures of wirings and methods for manufacturing the same, and thin film transistor array panels including the same and methods for manufacturing the same.

2. (b) Description of the Related Art

Generally, wiring of semiconductor devices is to transmit signals without delay.

In order to prevent delay or distortion of signals, materials having a low resistivity such as aluminum or aluminum alloy are generally used. However, bad physical and chemical properties of the aluminum or aluminum alloy easily oxidizes and corrodes the aluminum or aluminum alloy, when connecting other conductive material in a contact portions, accordingly the characteristics of semiconductor devices are deteriorated. To improve contact properties of the wire made of aluminum and aluminum alloy, a different material is then inserted. However, to form the wire of multi-layered structure, several etchant to pattern the wire of multi-layered structure and several steps of the photolithography are needed. Accordingly, the manufacturing method is complicated, increasing production costs.

On the other hand, a liquid crystal display (LCD) is one of the most popular flat panel displays (FPDs). The liquid crystal display has two panels having electrodes for generating electric fields and a liquid crystal layer interposed therebetween. The transmittance of incident light is controlled by the intensity of the electric field applied to the liquid crystal layer.

In the most widely used liquid crystal display, the field-generating electrodes are provided at both panels, and one of the panels has switching elements such as thin film transistors.

In order to prevent delay or distortion of signals, materials having a low resistivity such as aluminum or aluminum alloy are also used in the liquid crystal display. However, when ITO (indium tin oxide) as a transparent electrode is used as a pixel electrode or to reinforce pad portions, the poor contact properties between aluminum or aluminum alloy and indium tin oxide (ITO) requires a different material to be inserted therebetween and the aluminum or aluminum alloy must be removed in the pad portions to prevent the corrosion of aluminum and aluminum alloy. Accordingly, the manufacturing method is complicated.

On the other hand, a thin film transistor array panel is manufactured by a photolithography process. Since the photolithography process is expensive, the number of the photolithography steps needs to be minimized.

SUMMARY OF THE INVENTION

It is therefore an object of the present invention to provide contact structures having good contact properties made of a low resistivity material and methods for manufacturing the same.

It is another object of the present invention to provide a thin film transistor array panel having contact structures of good contact properties and methods for manufacturing the same.

It is another object of the present invention to simplify manufacturing methods of thin film transistor array panels for liquid crystal displays.

These and other objects are provided, according to the present invention, by executing through thermal treatment process using annealing and forming a conductive layer made of indium zinc oxide, wherein the conductive layer is connected to a wire made of a metal layer of aluminum-based material.

In a method for manufacturing a contact structure of a wire according to the present invention, a wire made of a metal is formed on a substrate, and an inorganic insulating layer covering the wire is deposited. Then, a thermal treatment process is executed and the inorganic insulating layer is patterned to form a contact hole exposing the wire. Next, a conductive layer, which is electrically connected to the wire, is formed.

It is desirable that an annealing step as thermal treatment process is executed, and the annealing step in the range of 280–400° C.

It is desirable that the metal layer is made of aluminum-based material, the inorganic insulating layer is made of silicon-nitride, and is deposited in the range of 250–400° C.

The conductive layer may be formed of a transparent conductive material, such as indium zinc oxide, and it is desirable that indium zinc oxide is deposited in the range of less than 250° C.

The contact structure of the wire and the method for manufacturing the same may be adapted to a manufacturing method of a thin film transistor array panel.

First, a gate wire, a data wire and a semiconductor layer are formed, and an insulating layer covering them is formed. Then, a thermal treatment process is executed, then the insulating layer is patterned to form a contact hole exposing the gate pad and/or the data wire. Next, a transparent conductive layer electrically connected to the gate wire and/or the data wire is formed.

It is desirable that the gate wire and/or the data wire include a conductive layer of aluminum-based material and the insulating layer is made of silicon-nitride.

It is desirable that the insulating layer is deposited in the range of 250–400° C. and an annealing step as the thermal treatment is executed in the range of 250–400° C.

The transparent conductive layer may be made of indium zinc oxide, and it is desirable that indium zinc oxide is deposited in the range of less than 250° C.

More concretely, a first conductive layer is deposited and patterned on an insulating substrate to form a gate wire including a gate line and a gate electrode connected to the gate line, and a gate insulating layer is deposited. A semiconductor layer is formed, and a conductive layer is deposited thereon and patterned to form a data wire including a data line intersecting the gate line, a source electrode connected to the data line and adjacent to the gate electrode and a drain electrode opposite to the source electrode with respect to the gate electrode. Next, a passivation layer is deposited and a thermal treatment process is executed. Then, the passivation layer is patterned to form a first contact hole exposing the drain electrode, and a pixel electrode electrically connected to the drain electrode through the first contact hole is formed on the passivation layer.

Here, it is desirable that the thermal treatment is executed through annealing step in the range of 250–400° C., and the first and the second conductive layer include aluminum-based material.

Furthermore, it is desirable that the gate insulating layer and the passivation layer are deposited in the range of 250–400° C. and made of silicon-nitride.

The pixel electrode may be formed of indium zinc oxide as transparent conductive material.

The gate wire further comprises a gate pad connected to the gate line, and the data wire further comprises a data pad connected to the data line, and the passivation layer has a second and a third contact hole along with the gate insulating layer respectively exposing the gate pad and the data pad. A redundant data pad and a redundant gate pad, which are respectively and electrically connected to the gate pad and the data pad through a second and a third contact holes of the passivation layer, may be formed when forming the pixel electrode.

The data wire and the semiconductor layer are together formed by photolithography process using a photoresist pattern having different thicknesses depending on the positions. The photoresist pattern may have a first portion having a first thickness, a second portion having a second thickness larger than the first portion, and a third portion having a third thickness smaller than the first thickness and except for the first and the second portions.

A mask used for forming the photoresist pattern may have a first, a second, and a third part, a transmittance of the third part is higher than the first and the second parts, a transmittance of the first part is higher than the second part. The first and the second portion of the photoresist pattern may be respectively aligned on portion between the source electrode and the drain electrode, and the data wire.

It is desirable that the first part of the mask includes a partially transparent layer, or a slit pattern smaller than the resolution of the exposure used in the exposing step, to regulate the transmittance of the first part, and the thickness of the first portion is less than the half of the thickness of the second portion.

An ohmic contact layer may be formed between the data wire and the semiconductor layer, and the data wire, the ohmic contact layer, and the semiconductor layer may be formed in the same photolithography process.

Here, the contact holes may have the various shape including corners or rounds, and the sizes of the first contact holes may be more than 4 $\mu$m*4 $\mu$m and less than 10 $\mu$m*10 $\mu$m.

At this time, the conductive layers of aluminum-based material, and IZO directly contact each other, and the conductive layers of aluminum-based material may have flat surfaces.

BRIEF DESCRIPTION OF THE DRAWINGS

The accompanying drawings, which are incorporated in and constitute a part of the specification, illustrate an embodiment of the invention, and, together with the description, serve to explain the principle of the invention.

FIGS. 13B and 13C are respectively cross-sectional views taken along the lines XIIIB–XIIIB' and XIIIC–XIIIC' of FIG. 13A.

DETAILED DESCRIPTION OF THE PREFERRED EMBODIMENTS

Figure 1:
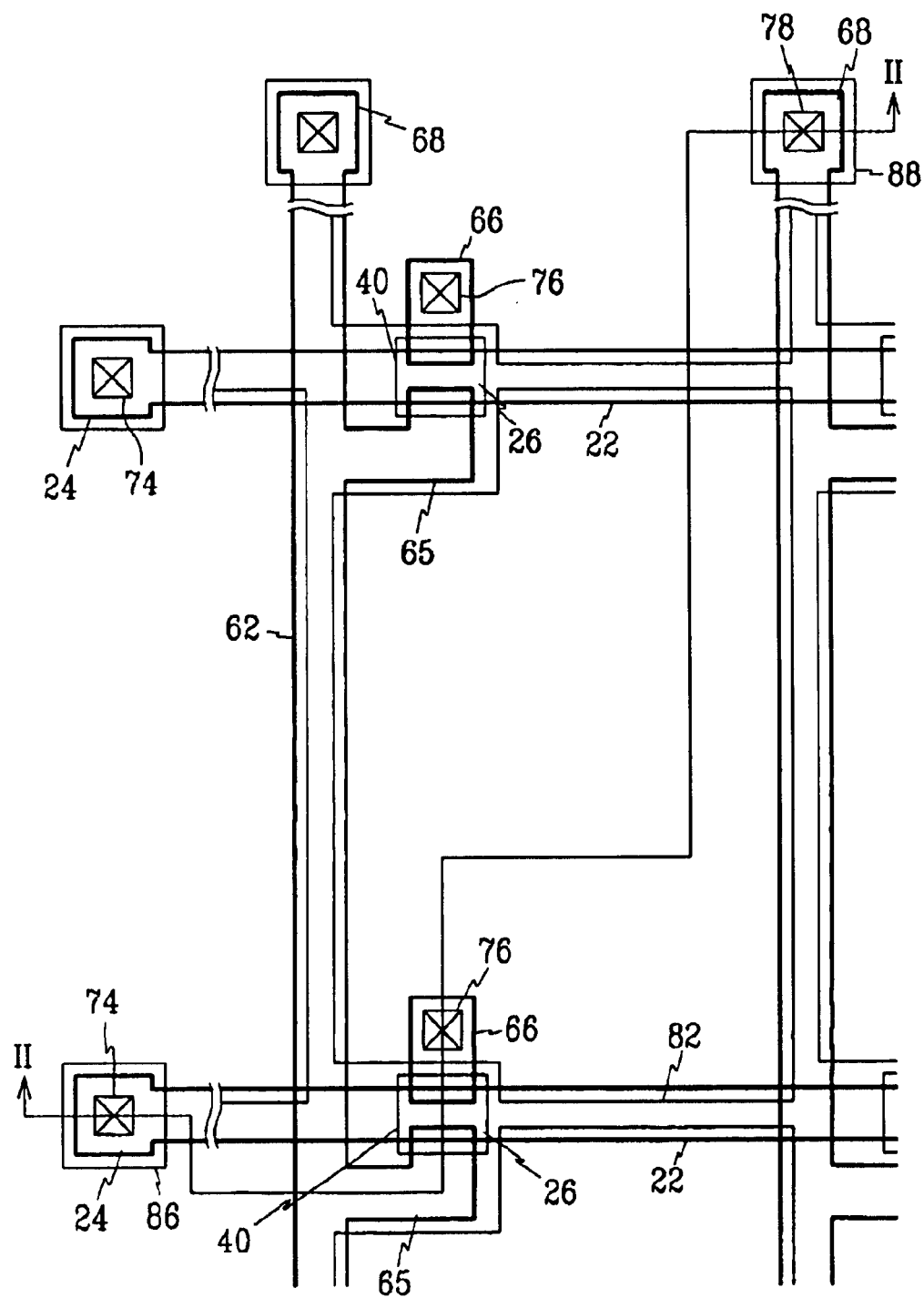
FIG. 1 is a layout view of a thin film transistor array panel for a liquid crystal display according to the first embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. In the drawings, the thickness of layers and regions are exaggerated for clarity. Like numerals refer to like elements throughout. It will be understood that when an element such as a layer, region, or substrate is referred to as being "on" another element, it can be directly on the other element or intervening elements may also be present. In contrast, when an element is referred to as being "directly on" another element, there are no intervening elements present.

A wiring of a semiconductor device is made of a material, which has a low resistivity less than 15 $\mu\Omega$cm, such as aluminum, aluminum alloy. This wiring generally is connected to different conductive layer to receive external electrical signals from outside or to deliver electrical signals to outside. The wiring should not be easily corroded on the connection to the different conductive layer during manufacturing processes. In a method for manufacturing a contact structure of a wiring according to the present invention, a wiring of a metal layer made of material having a low resistivity such as aluminum, aluminum alloy is formed on a substrate, and an inorganic insulating layer covering the wiring is deposited. Next, annealing step as thermal treatment process is executed. At this time, all or part of aluminum oxide ($AlO_x$) layer having a high resistivity, which is formed on the metal layer made of aluminum or aluminum alloy during manufacturing process, is removed. Then, the inorganic insulating layer is patterned to form a contact hole on the wiring, then a conductive layer electrically connected to the wire through the contact hole is formed.

Here, it is desirable that the layer is annealing at the temperature range of 250–400° C. for 30 minute to 2 hour, and the insulating layer is deposited at the temperature range of 250–400° C.

Furthermore, it is desirable that the inorganic insulating layer is made of silicon-nitride, and the conductive layer is made of indium zinc oxide.

Here, since all or part of a residual layer including aluminum oxide ($AlO_x$) layer having a high resistivity, which is formed on the metal layer made of aluminum-based material during manufacturing process, is removed when executing annealing step, the metal layer of aluminum-based material, and the conductive layer of IZO directly contact each other in the contact portion of the contact structure. Accordingly, by executing annealing and using indium zinc oxide as the conductive layer connected the wire of aluminum-based material, contact resistance between the wires of aluminum-based material, and the conductive layer of IZO may be minimized and the corrosion generated in contact portion of them may be prevented.

This wire may be used as a gate wire or a data wire of a thin film transistor array panel for a liquid crystal display.

A structure of the TFT array panel and a method for manufacturing the same will now be described specifically.

First, the structure of a TFT array panel for a liquid crystal display according to the first embodiment of present invention will now be described specifically with reference to FIGS. 1 and 2.

Figure 2:
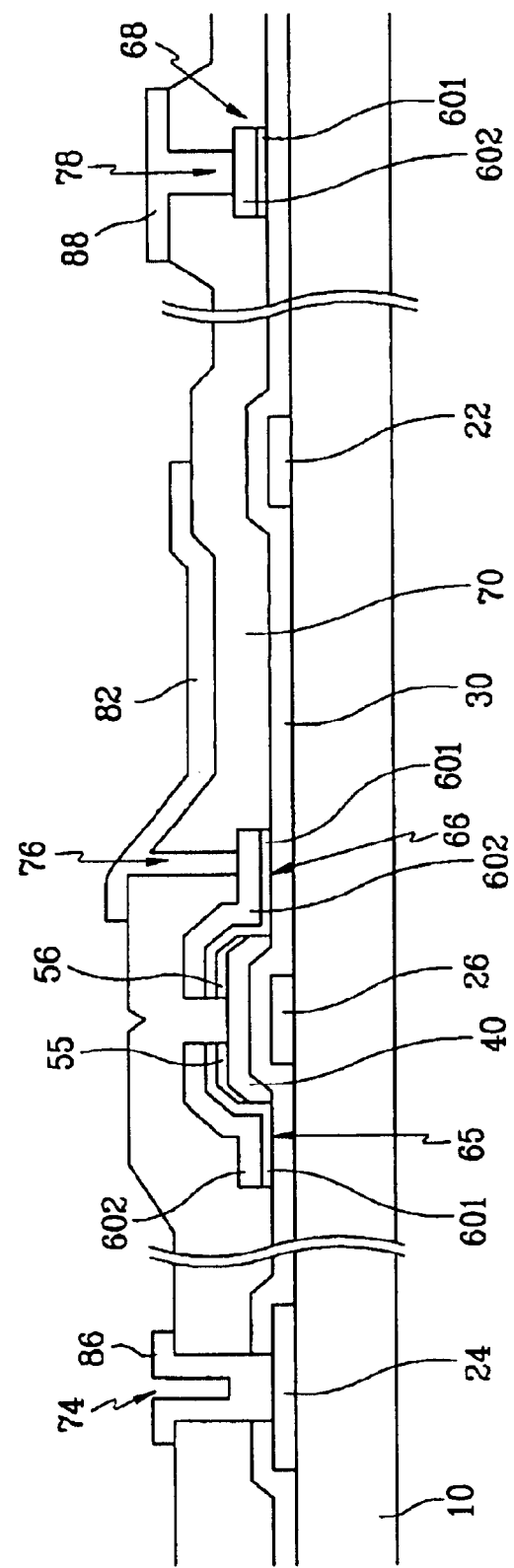
FIG. 2 is a cross-sectional view taken along lines II–II' of FIG. 1.

FIG. 1 is a layout view of a thin film transistor array panel for a liquid crystal display according to the first embodiment of the present invention, and FIG. 2 is the cross-sectional view taken along line II–II' of FIG. 1.

Gate wires made of conductive material having a low resistivity, such as aluminum (Al) or aluminum alloy (Al alloy), is formed on an insulating substrate 10. A gate wire includes a gate line (or scanning signal line) 22 extending in the horizontal direction in FIG. 1, a gate pad 24 connected to an end of the gate line 22 and which transmits a scanning signal from an external circuit to the gate line 22, and a gate electrode 26 which is a part of a thin film transistor and connected to the gate line 22.

A gate insulating layer 30 of silicon-nitride ($SiN_x$) is formed on and covers the gate wire parts 22, 24, and 26.

A semiconductor layer 40 (made of semiconductor such as hydrogenated amorphous silicon) is formed in an island-like shape on the gate insulating layer 30 of the gate electrode 26. Ohmic contact layers 55 and 56 (made of such materials as silicide or hydrogenated amorphous silicon heavily doped with impurities like phosphorus) are formed on the semiconductor layer 40.

A data wire made of conductive materials such as Mo or MoW alloy, Cr, Ta and Ti is formed on the ohmic contact layer patterns 55 and 56 and the gate insulating layer 30. The data wire has a data line 62 extending in the vertical direction in FIG. 1 and defining a pixel along with the gate line 22, a data pad 68 connected to an end of data line 62 and which transmits image signals from an external circuit to the data line 62, a source electrode 65 of a thin film transistor which is connected to the data line 62 and is extended on the ohmic contact layer 55, and a drain electrode 66 of the thin film transistor that is formed on the ohmic contact layer 56 opposite the source electrode 65 with respect to the gate electrode 26 and which is separated from the source electrode 65.

The data wire parts 62, 65, 66, and 68 may have a multiple-layered structure. When the data wire has a multiple-layered structure, it is preferable that one layer is made of a material having a low resistivity and another is made of a material having good contacting properties with other materials. Double layers of Cr/Al (or Al alloy) and Al/Mo are such examples. The data wire parts 62, 65, 66, and 68 includes a lower layer 601 made of Cr and an upper layer 602 made of Al alloy.

A passivation layer 70 of an insulating material such as $SiN_x$ is formed on the data wire parts 62, 65, 66, and 68, and the semiconductor layer 40 which is not covered by the data wire parts 62, 65, 66, and 68.

The passivation layer 70 has contact holes 76 and 78 respectively exposing the drain electrode 66 and the data pad 68, and also has (along with the gate insulating layer 30) another contact hole 74 exposing the gate pad 24. The contact holes 74, 76 and 78 may have the various shape with corners or rounds, and it is preferable that the contact holes 74, 76 and 78 may have various shapes including corners or rounds, the sizes of the contact hole 76 exposing the drain electrode 66 may be more than 4 $\mu$m*4 $\mu$m and less than 10 $\mu$m*10 $\mu$m, and the contact holes 74 and 78 are larger than the contact hole 76.

A pixel electrode 82, which receives an image signal and generates an electric field with a common electrode of an upper panel, is formed on the passivation layer 70 of the pixel. The pixel electrode 82 is physically and electrically connected to the drain electrode 66 through the contact hole 76, and receives the image signal from the drain electrode 66. A redundant gate pad 86 and a redundant data pad 88, respectively connected to the gate pad 24 and to the data pad 68 through the contact holes 74 and 78, are formed on the passivation layer 70. Here, the pixel electrode 82, and the gate and data pads 86 and 88 are made of IZO. In this structure according to the present invention, the metal layers 24, 66 and 68 of aluminum-based material, and the IZO layers 82, 86 and 88 directly contact each other in the contact portions of the contact holes 74, 76 and 78. At this time, the corrosion between the metal layers 24, 66 and 68 of aluminum-based material, and the IZO layers 82, 86 and 88 is not generated, and since all or part of a residual layer having high resistivity is removed between them, contact resistance between them is reduced.

Here, as shown in FIGS. 1 and 2, the pixel electrode 82 overlaps the gate lines 22 to make a storage capacitor. If there is not enough storage capacitance with this configuration, a storage wire may be formed with the same layer as the gate wire parts 22, 24, and 26.

With the structure of the thin film transistor array panel according to present invention, by forming the wire of aluminum and aluminum alloy, the delay and distortion of signals may be prevented in large scale LCDs. Also, the gate pad 24, the data pad 68 and the drain electrode 66, and the redundant gate pad 86, the redundant data pad 88 and the pixel electrode 82 directly contact respectively, accordingly the contact resistance of contact structure in the contact holes 74, 76 and 78 may be minimized. Also, a pad portion is made of conductive materials having low contact resistance and the metal layer made of aluminum or aluminum alloy is not corroded, therefore a reliable pad portion may be obtained.

A manufacturing method of a thin film transistor array panel according to a first embodiment of the present invention will now be described with reference to the FIGS. 3A to 7B and FIGS. 1 to 2.

Figure 3A:
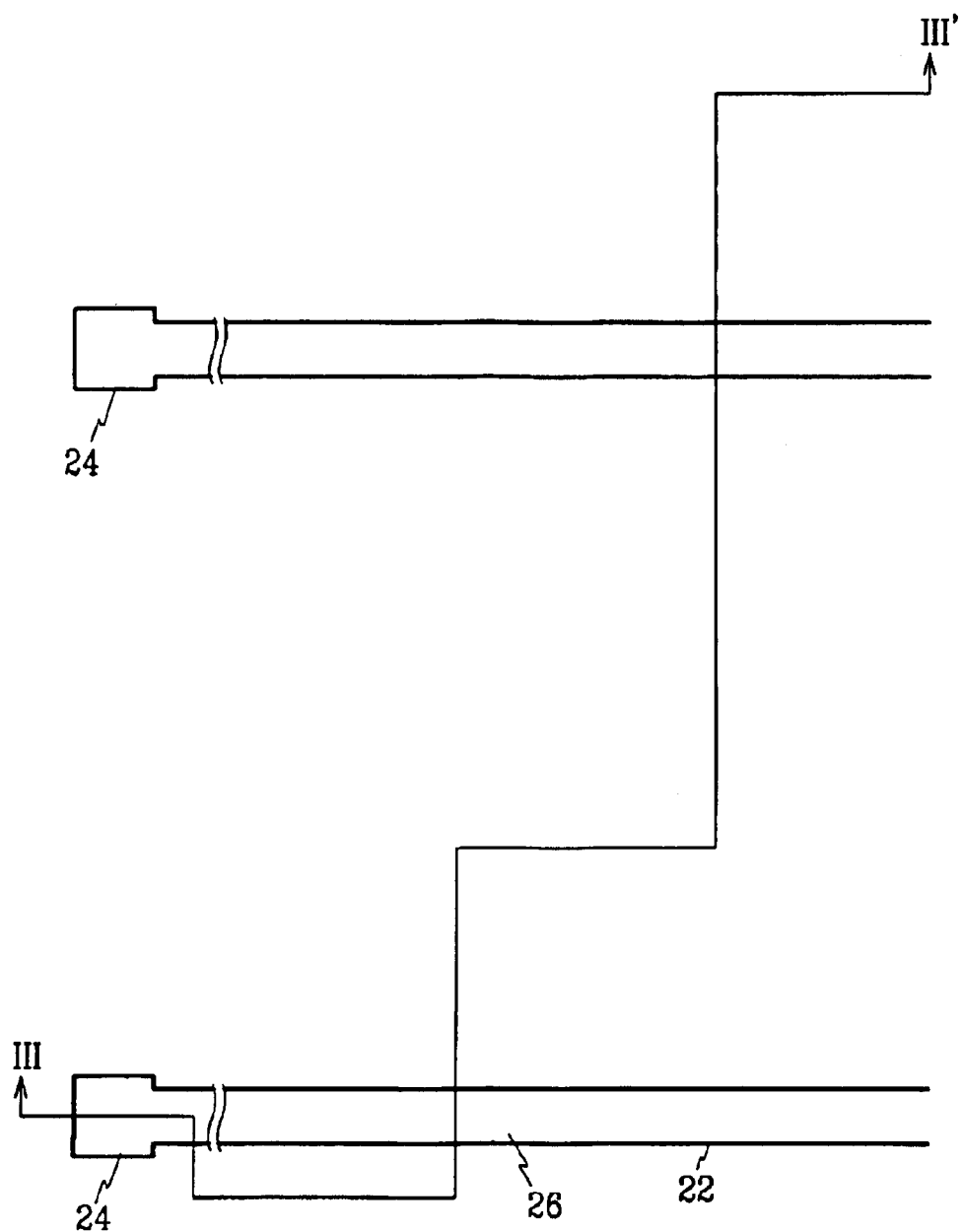
FIGS. 3A, 4A, 5A and 7A are layout views of the thin film transistor array panel according to the first embodiment of the present invention at middle manufacturing steps of a manufacturing method.
Figure 3B:
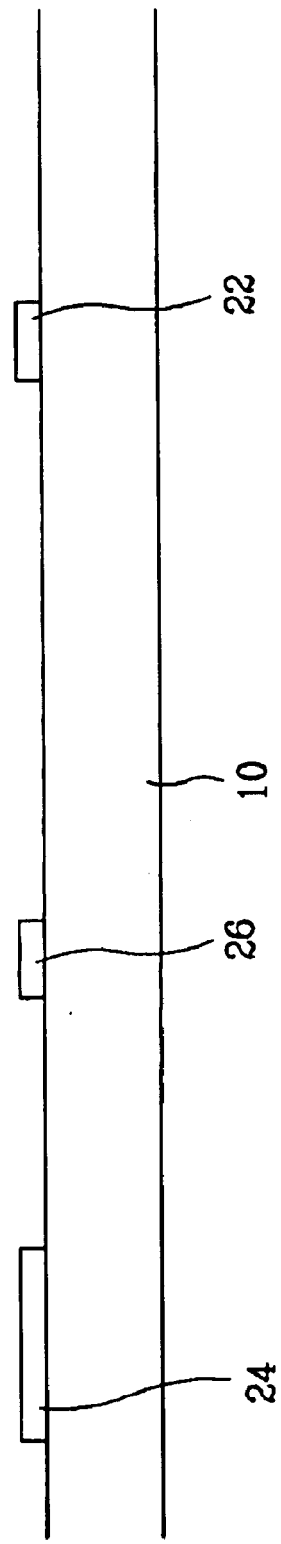
FIG. 3B is a cross-sectional view taken along the line IIIB–IIIB' of FIG. 3A.

At first, as shown in FIGS. 3A and 3B, a conductive layer having a low resistivity such as aluminum or aluminum alloy are deposited and patterned on a substrate 10. Preferably, in this embodiment, a target of Al—Nd alloy including 2 at % (atomic percentage) of Nd was sputtered at a temperature of about 150° C. to form a conductive layer to a thickness of about 2,500 Å on the substrate 10, then the conductive layer is patterned to form gate wire parts including a gate line 22, a gate electrode 26, and a gate pad 24 by dry or wet etching the conductive layer through a photolithography process.

Figure 4A:
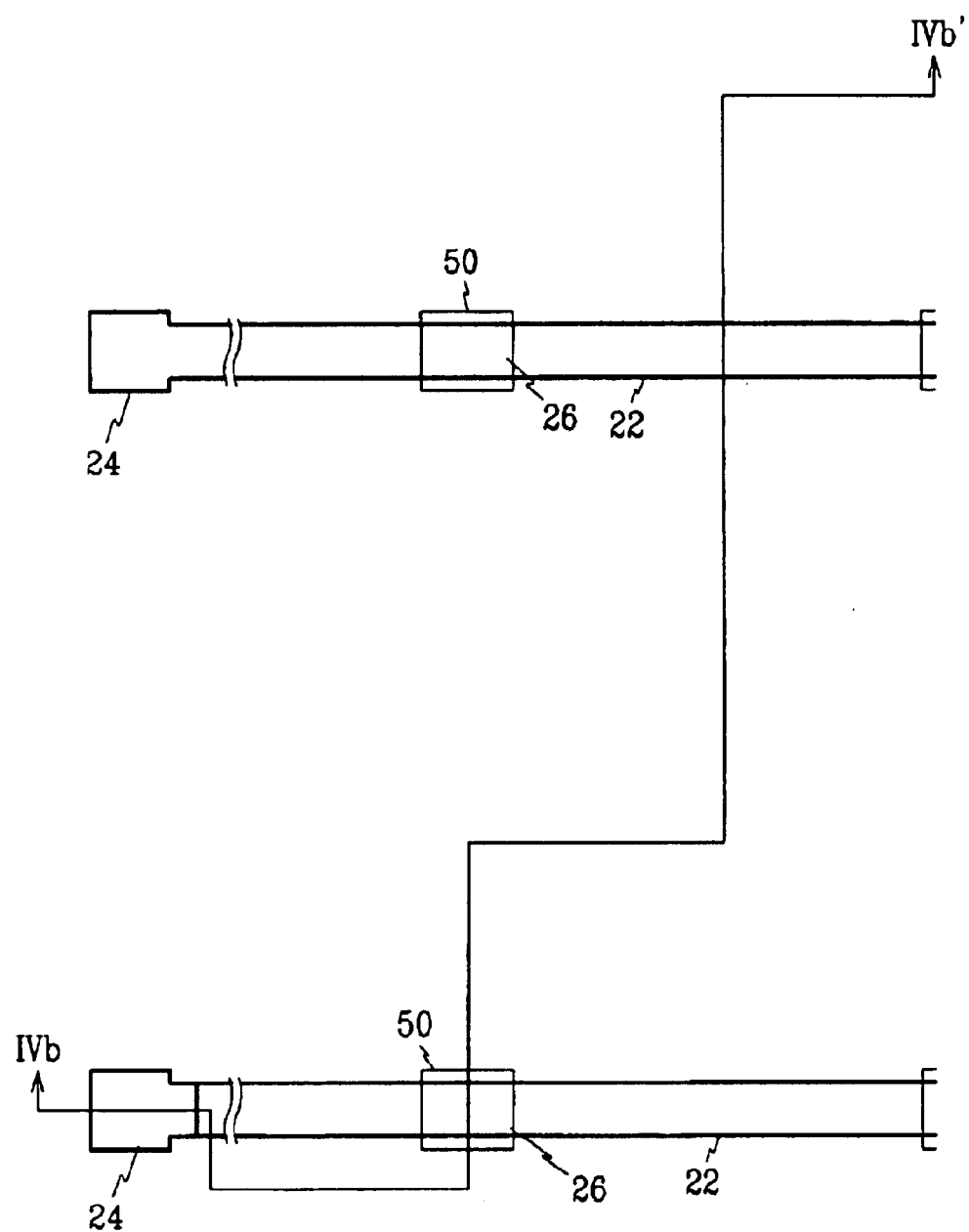
Figure 4B:
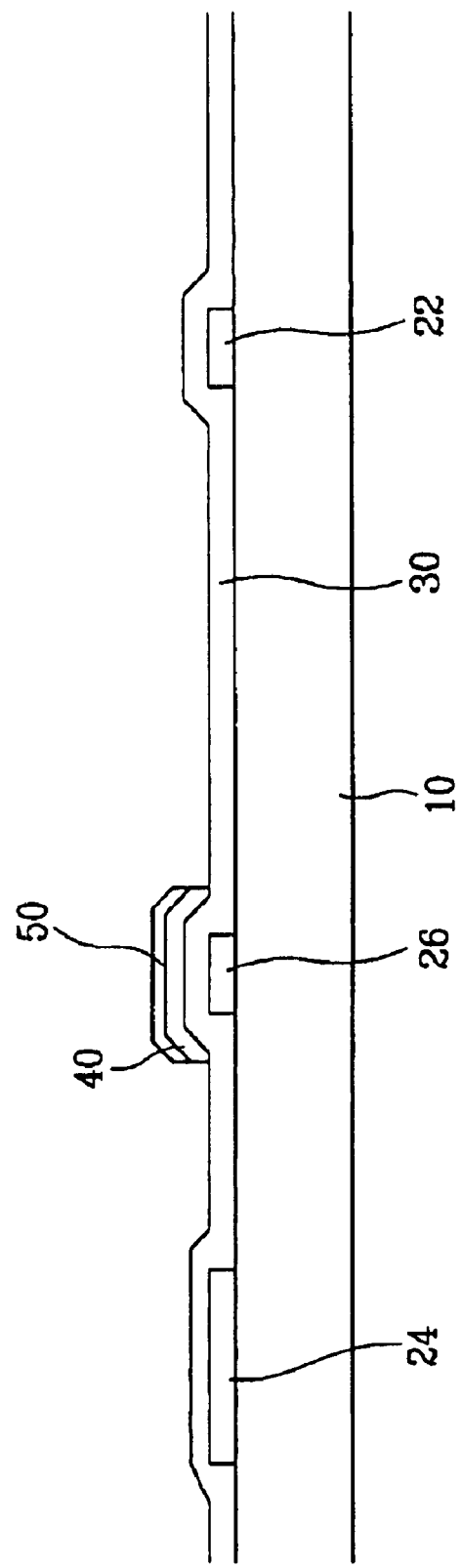
FIG. 4B is a cross-sectional view taken along the line IVB–IVB' of FIG. 4A at the next manufacturing step following the step represented in FIG. 3B.

Next, as shown in FIGS. 4A and 4B, a gate insulating layer 30, an amorphous silicon semiconductor layer 40, and a doped amorphous silicon ohmic contact layer 50 are sequentially layered. Then, the semiconductor layer 40 and ohmic contact layer 50, which are both island shaped, are formed on top of the gate electrode 26 using a mask patterning process. Here, it is preferable that a silicon-nitride (SiNx) is deposited to the thickness of 2,000–5,000 Å and at the temperature range of 250–400° C. to form the gate insulating layer 30. Preferably, in this embodiment, the gate insulating layer 30 is formed at a temperature of about 300° C. to a thickness of about 4,500 Å.

Figure 5A:
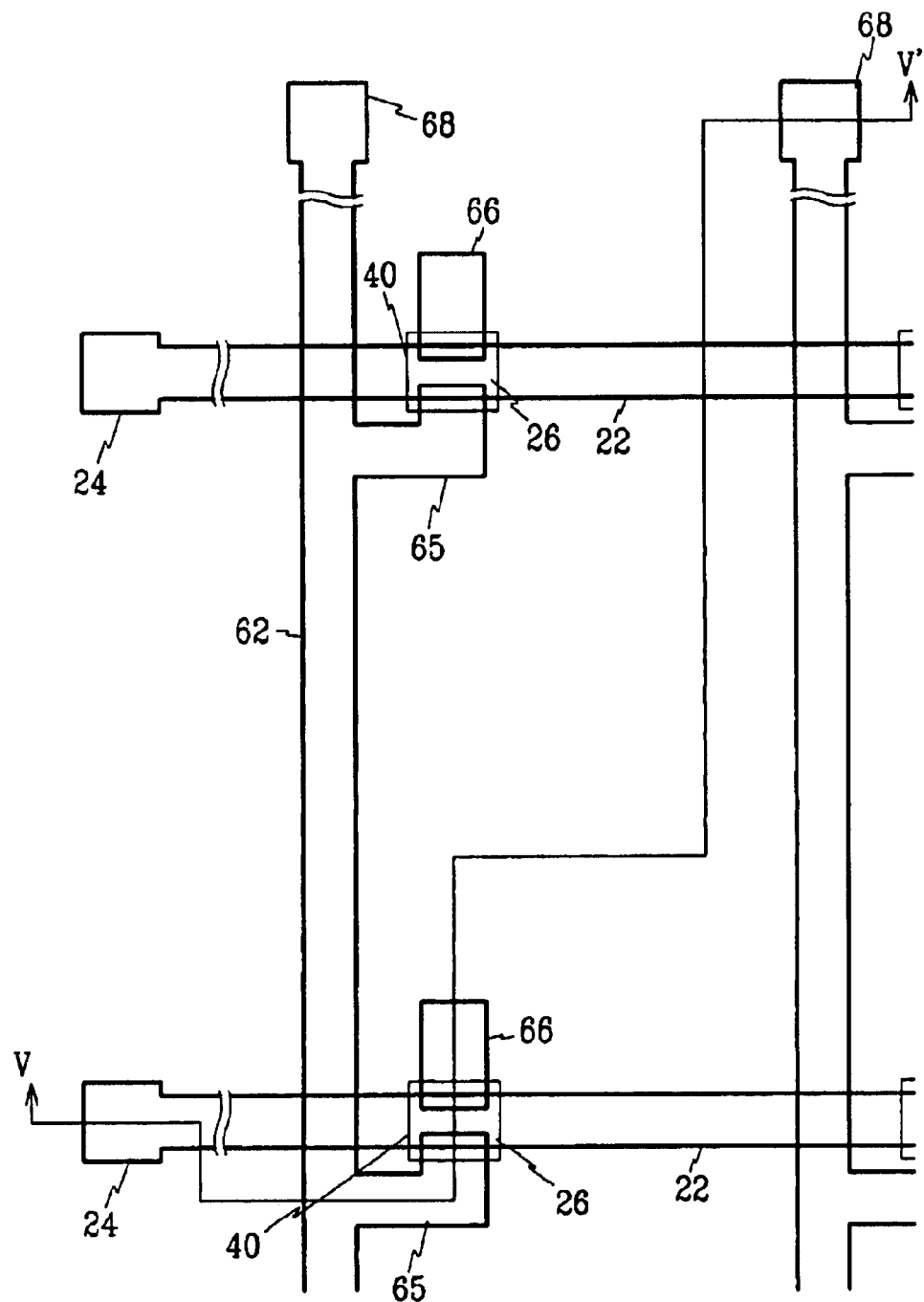
Figure 5B:
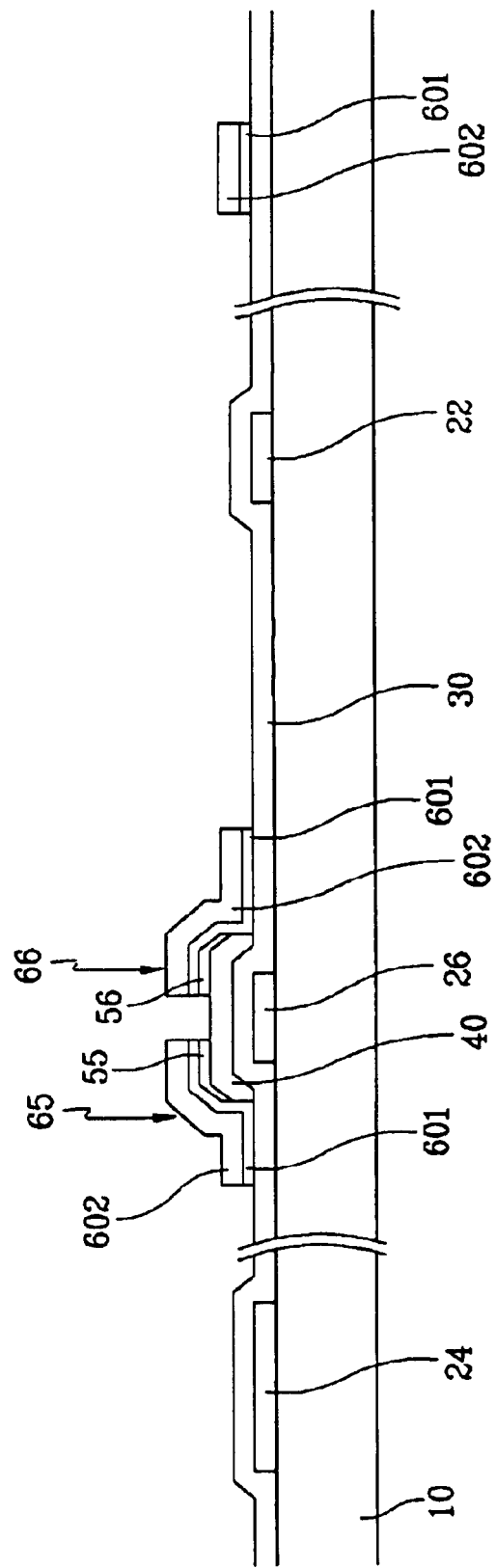
FIG. 5B is a cross-sectional view taken along the line V–V' of FIG. 5A at the next manufacturing step following the step represented in FIG. 4B.

Then, as shown in FIGS. 5A and 5B, a lower layer 601 such as chromium, molybdenum, molybdenum alloy, titanium or tantalum, and a upper layer 602 having a low resistivity such as aluminum or aluminum alloy are respectively deposited to a thickness of about 500 Å and 2500 Å by such methods as sputtering and patterned through a photolithography process using a mask to form a data wire including a data line 62 intersecting the gate line 22, a source electrode 65 connected to the data line 62 and extended over the gate electrode 26, a drain electrode 66 separated from the source electrode 65 and opposite the source electrode 65 with respect to the gate electrode 26, and a data pad 68 connected to the end of the data line 62. Here, the upper and the lower layers 602 and 601 may be all wet-etched, and the upper and the lower layers 602 and 601 may be wet-etched and dry-etched, respectively. Preferably, in this embodiment, a target of Al—Nd alloy including 2 at % of Nd was sputtered at a temperature of about 150° C. to form the upper layer 602 to a thickness of about 2,500 Å.

Then, the ohmic contact layer 50 is plasma-etched by using the data wires 62, 65, 66, and 68 as a mask to divide the ohmic contact layer 50 at the center of the gate electrode 26, and to expose the central portion of the amorphous silicon layer 40 between the ohmic contact layers 55 and 56. Oxygen plasma may follow to stabilize the surface of the amorphous silicon layer 40.

Figure 6:
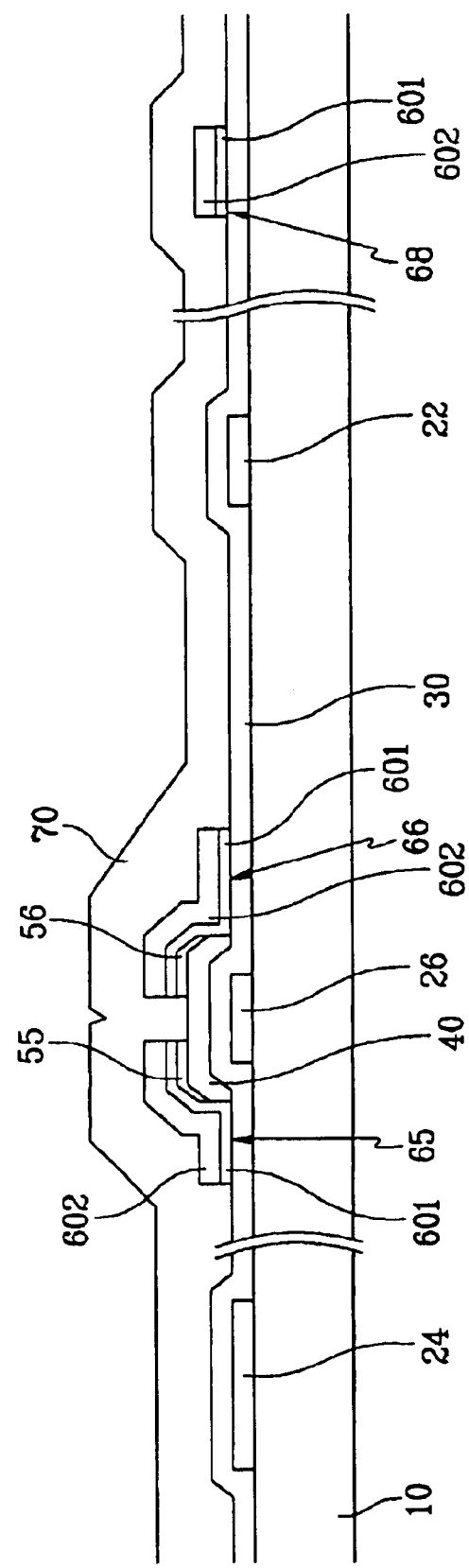
FIG. 6 is a cross-sectional view taken along the line V–V' of FIG. 5A at the next manufacturing step following the step represented in FIG. 5B.

After forming data wire parts 62, 65, 66, and 68 by the above steps, a passivation layer 70 is formed by depositing an inorganic insulator such as silicon-nitride in the range of 250–400° C., as shown in FIG. 6, and annealed at the range of 250–400° C. for 30 minute to 2 hour. Preferably, in this embodiment, the passivation layer 70 is deposited at the temperature of about 300° C. to a thickness of about 2,000–3,000 Å, and the annealing step is executed at the temperature of about 300° C. for about 5 minute to 1 hour. When annealing, a residual layer, which has a high resistivity and is formed on the aluminum-based layer of the wire 22, 24, 26, 62, 65, 66 and 68 may be removed. For example, the residual layer including $Al_2O_3$ formed by the reaction of oxygen and aluminum is formed during manufacturing process, and is removed when annealing. This will be described with the reference of FIGS. 19 and 20. Furthermore, it is desirable that an alkali cleaning or an electrolyte cleaning may be necessary before depositing the passivation layer 70 to remove organic material or the residual material such as $Al_2O_3$ on the data wire 62, 65, 66 and 68, and a cleaning using Al etchant for etching a material including aluminum may be executed.

Figure 7A:
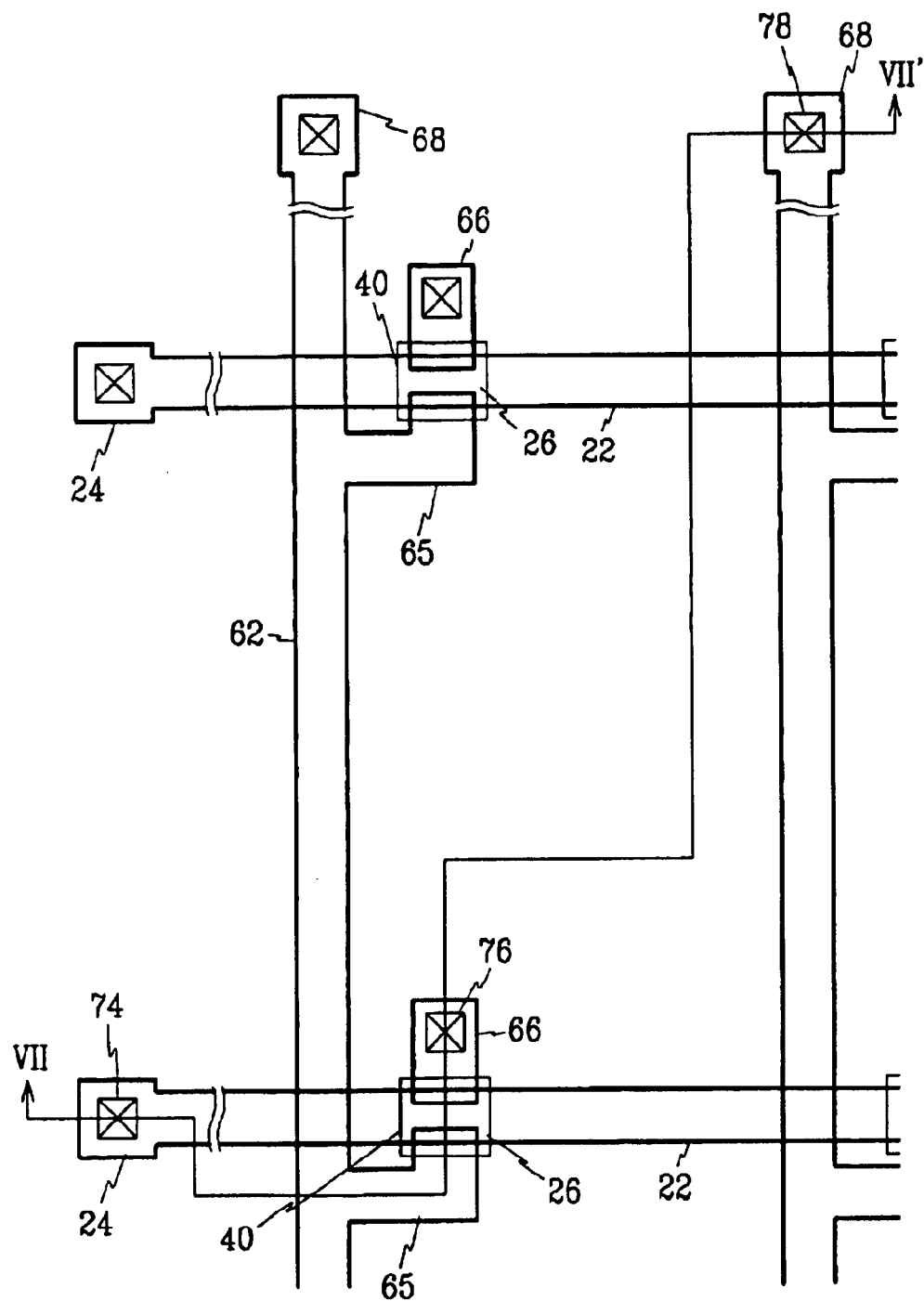
Figure 7B:
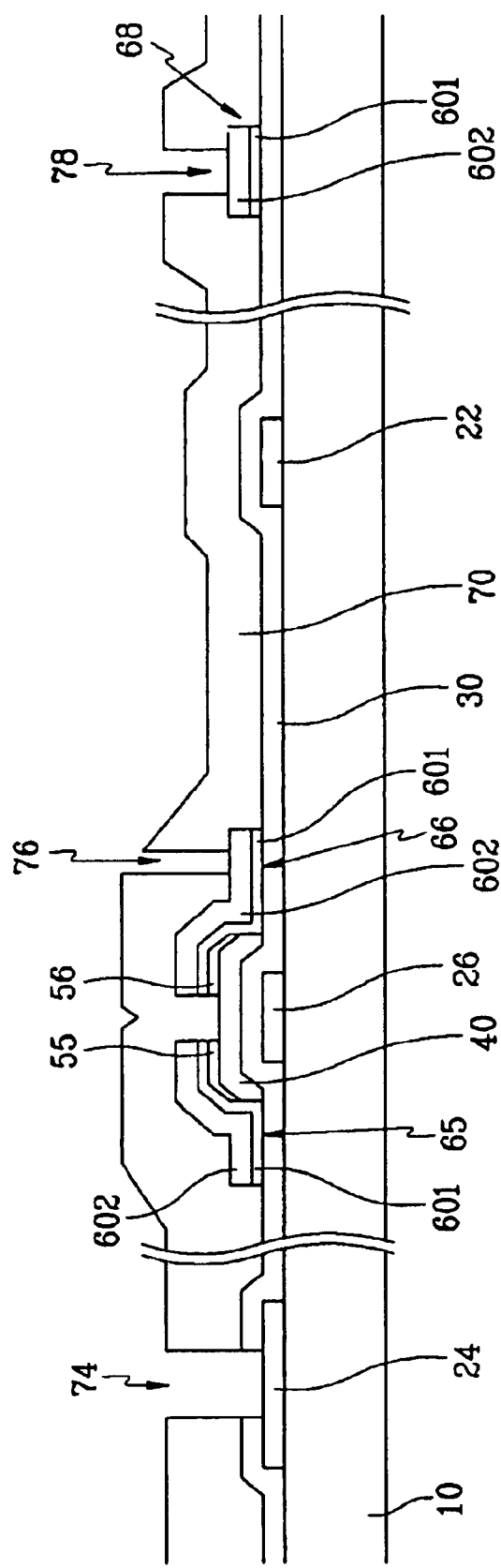
FIG. 7B is a cross-sectional view taken along the line VII–VII' of FIG. 7A at the next manufacturing step following the step represented in FIG. 5B.

Then, as shown in FIGS. 7A and 7B, contact holes 74, 76, and 78 respectively exposing the gate pad 24, the drain electrode 66, and the data pad 68 are formed by etching the passivation layer 70 and the gate insulating layer 30. Here, it is desirable that the metal layer of aluminum-based material should not be etched in etch condition when forming the contact holes 74, 76 and 78, and fluorine group as an etch gas may be used. At this time, the contact holes 74, 76, 78 may have a various shape having corners or rounds, it is desirable that the size of the contact hole 76 exposing the drain electrode 66 may be more than 4 μm*4 μm and less than 10 μm*10 μm, will be described later. Of course, the contact holes 74 and 78 respectively exposing the gate and the data pads 24 and 68 may be larger than that of the contact hole 76.

Next, as shown in FIGS. 1 to 2, an IZO layer is deposited by a method such as sputtering and etched by photolithography using a mask to form a pixel electrode 82, a redundant gate pad 86 and a redundant data pad 88 electrically connected to the drain electrode 66, the gate pad 24 and the data pad 68 through the contact holes 76, 74 and 78 via the reacting layers 320 and 670, respectively. At this time, in this manufacturing method according to the present invention, by removing the residual layer having a high resistivity on the metal layers 24, 66 and 68 by annealing before patterning the passivation layer 70, the metal layers 24, 66 and 68 made of aluminum-based material, and the IZO layers 82, 86 and 88 directly contact each other respectively in the contact portions of the contact holes 74, 76 and 78. Accordingly, in the contact holes 74, 76 and 78, the metal layers 24, 66 and 68 made of aluminum-based material directly contact the IZO layers 82, 86 and 88 respectively, minimizing the contact resistance of contact structure in the contact holes 74, 76 and 78. Also, the corrosions between the metal layers 24, 66 and 68 made of aluminum-based material, and the IZO layers 82, 86 and 88 are prevented. In this embodiment, IDIXO (indium x-metal oxide) produced by Idemitsu Company is used as an IZO target to form the IZO layers 82, 86 and 88. It is desirable that the IZO target includes $In_2O_3$ and ZnO, and the content of Zn is in the range of 15–20 at %, and the IZO layer is deposited at the temperature range of less than 250° C. to minimize contact resistance.

In the manufacturing method according to the embodiment of the present invention, by executing the annealing step before depositing the IZO layer to improve contact properties between the IZO and metal of aluminum-based material, the reliability of the contact portions may be guaranteed by minimizing contact resistance of contact portions including the pad portions.

In the first embodiment, the thin film transistor array panel is manufactured by a photolithography process using five photomasks, but a thin film transistor array panel may be manufactured by a photolithography process using four photomasks, and this will be described with reference to FIGS. 8 to 10.

Figure 8:
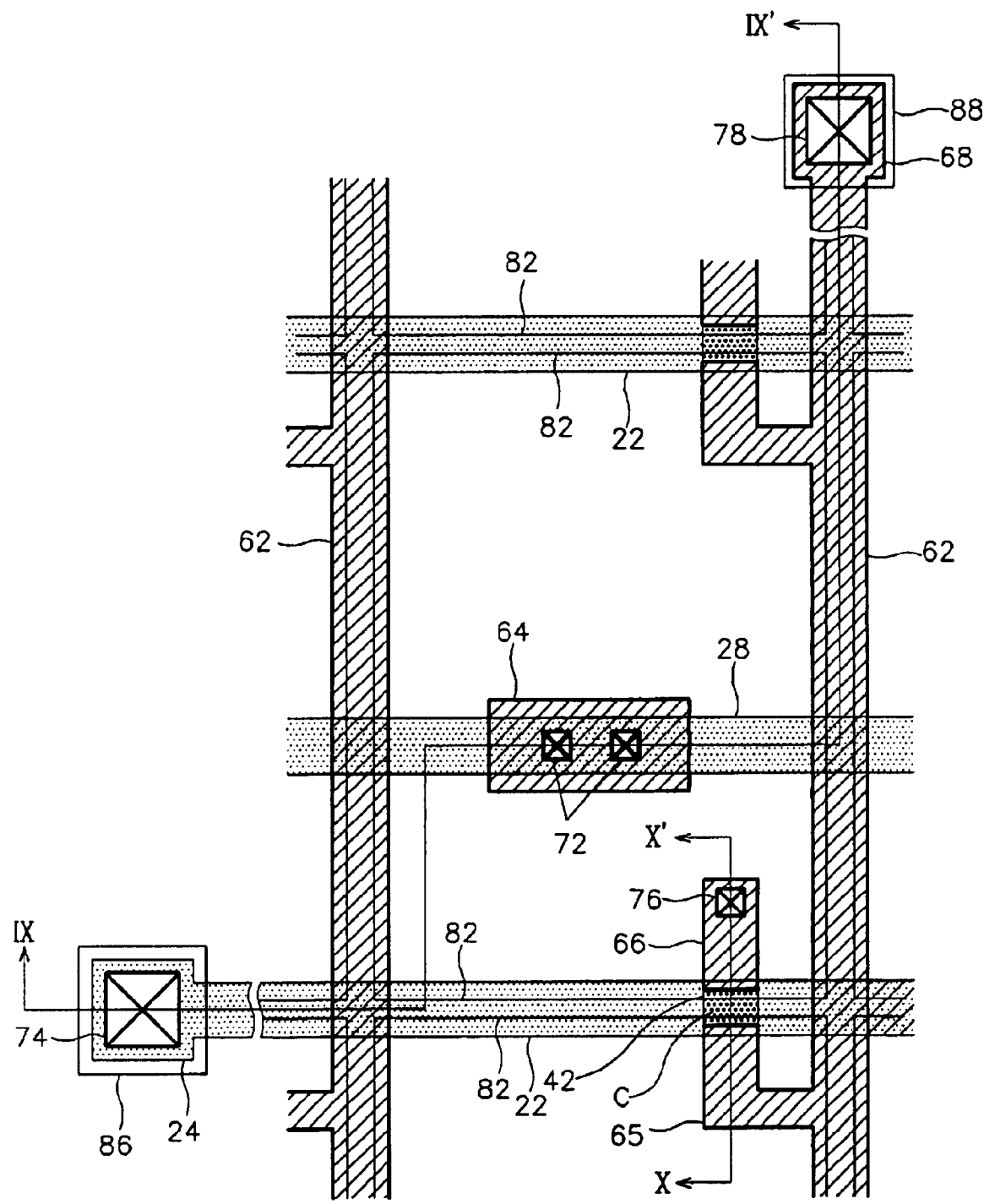
FIG. 8 is a layout view of a thin film transistor array panel for a liquid crystal display according to the second embodiment of the present invention.
Figure 9:
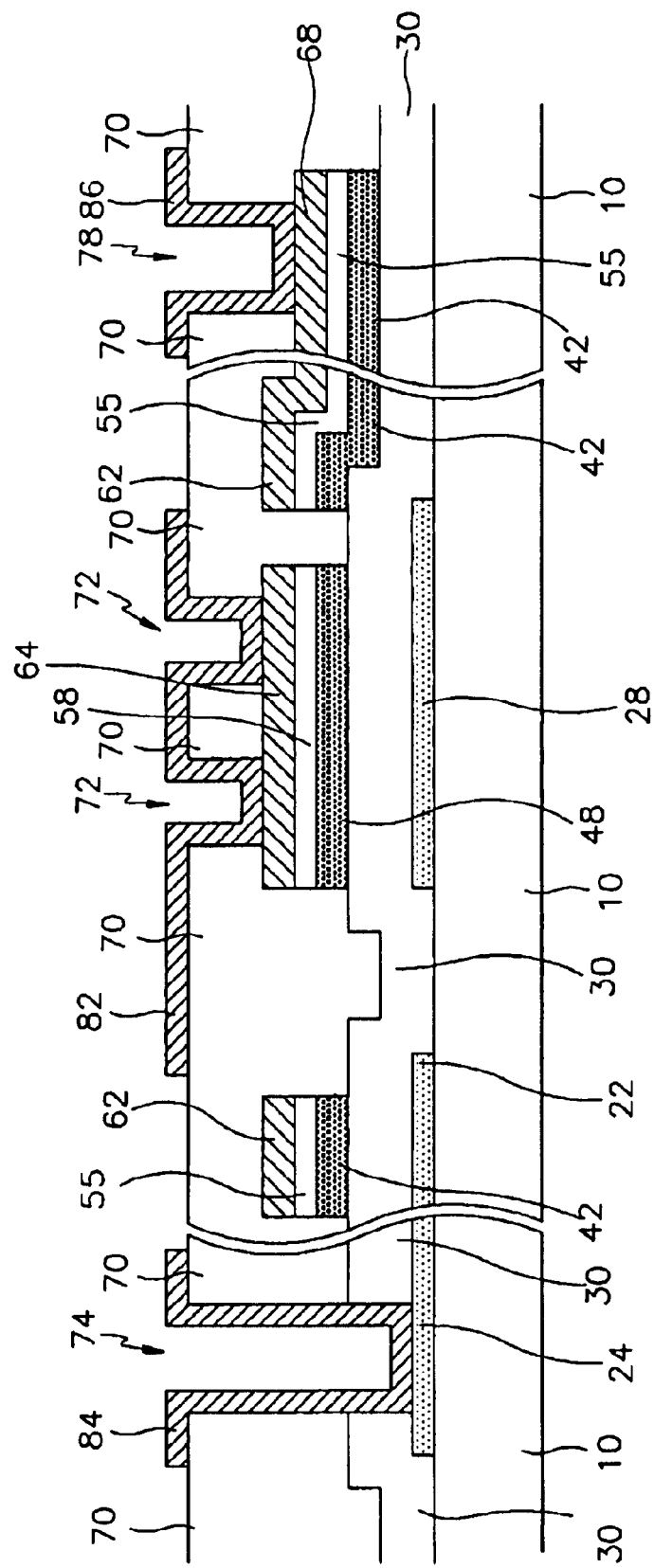
FIGS. 9 and 10 are cross-sectional views taken along lines IX–IX' and X–X' of FIG. 8, respectively.
Figure 10:
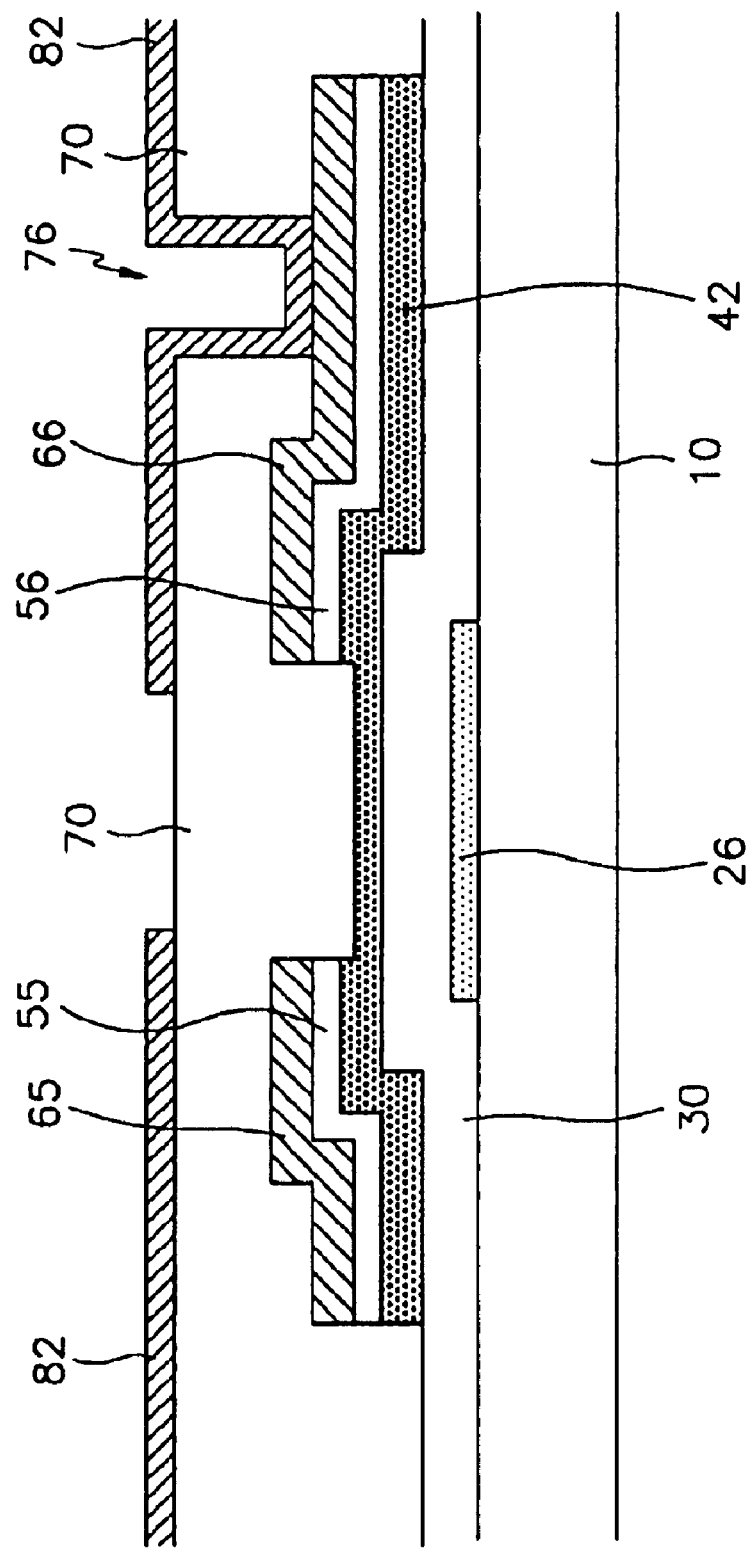

FIG. 8 is a layout view of a thin film transistor array panel for a liquid crystal display according to the second embodiment of the present invention, and FIGS. 9 and 10 are the cross-sectional views taken along lines IX–IX' and X–X' of FIG. 8.

Gate wires made of metal or conductive material such as aluminum (Al) or aluminum alloy and including a gate line 22, a gate pad 24 and a gate electrode 26, like the first embodiment, are formed on an insulating substrate 10. Also, the gate wires include a storage electrode 28 that is parallel with the gate line 22 and receives a voltage such as a common voltage applied to a common electrode (not shown) on an upper panel of the liquid crystal display. The storage electrode 28 provides storage capacitance along with a conductor pattern 64 connected to a pixel electrode 82 that will be described later. The liquid crystal capacitor includes the pixel electrode 82 and the common electrode. The storage electrode 28 may not be provided if the storage capacitance between the pixel electrode 82 and the gate line 22 is sufficient.

Gate insulating layers 30 of silicon-nitride (SiNx) are formed on the insulating substrate 10, and covers the gate wire parts 22, 24, 26, and 28.

Semiconductor patterns 42 and 48 (made of semiconductor such as hydrogenated amorphous silicon) are formed on the gate insulating layer 30. Ohmic contact layer patterns 55, 56, and 58 (made of such materials as doped amorphous silicon heavily doped with impurities like phosphorus) are formed on the semiconductor patterns 42 and 48.

A data wire made of conductive materials such as Mo or Mo alloy, Cr, Ti and Ta is formed on the ohmic contact layer patterns 55, 56, and 58. The data wire has a data line part including a data line 62 extending in the vertical direction on FIG. 7, a data pad 68 connected to an end of data line 62 and transmitting image signals from an external circuit to the data line 62 and a source electrode 65 of a thin film transistor connected to data line 62. The data wire also includes a drain electrode 66 of the thin film transistor on the other side of the gate electrode 26 or the channel part C of a thin film transistor and is separated from the data line parts 62, 64, 65, and conductor pattern 64 used for storage capacitance located on the storage electrode 28. When the storage electrode 28 is not provided, neither is the conductor pattern 64.

The data wire parts 62, 64, 65, 66, and 68 may have a sigle-layered structure made of a metal of aluminum-based material, as the gate wire 22, 24, 26 and 28, but the data wire may have a double-layered structure including one layer made of a material such as aluminum or aluminum alloy and another layer made of a material such as Mo or Mo alloy, Cr, Ti and Ta.

The ohmic contact layer patterns 55, 56, and 58 reduce the contact resistance between the semiconductor patterns 42 and 48 and the corresponding data wire parts 62, 64, 65, 66, and 68, and have the same layout as the data wire parts 62, 64, 65, 66, and 68. In other word, a first ohmic contact layer portion 55 under the data line part has the same shape as the data line parts 62, 68, and 65, a second ohmic contact layer portion 56 under the drain electrode part has the same shape as the drain electrode 66, and a third ohmic contact layer portion 58 under the conductor pattern 64 has the same shape as the conductor pattern 64 for the storage capacitor.

The semiconductor patterns 42 and 48 except for the channel part C of the thin film transistor have the same layout as the corresponding data wire parts 62, 64, 65, 66, and 68 and the corresponding ohmic contact layer patterns 55, 56, and 58. Or, more concretely, the semiconductor portion 48, the conductor pattern 64, and the third ohmic contact layer portion 58 all have the same shape, but the semiconductor portion 42 has a different shape from the data wire and the ohmic contact layer pattern. In other words, the data line parts 62, 68, and 65, especially the source electrode 65 and the drain electrode 66, are separated from each other by the channel part C of thin film transistor and the portions 55 and 56 of ohmic contact layer pattern thereunder are also separated from each other, but the semiconductor portion 42 is not divided into two pieces so that it traverses the channel of a thin film transistor.

A passivation layer 70 made of silicon-nitride is formed on the data wire parts 62, 64, 65, 66, and 68.

The passivation layer 70 have contact holes 76, 78 and 72 respectively exposing the drain electrode 66, the gate pad 24, the data pad 68 and the conductor pattern 64 provided for storage capacitance, and a contact hole 74 exposing the reaction layer 320 on the gate pad 24 along with the gate insulating layer 30.

Pixel electrodes 82 that receive an image signal and generate an electric field with a common electrode of an upper panel are formed on the passivation layer. The pixel electrode 82 is made of a transparent conductive material such as indium zinc oxide (IZO). The pixel electrode 82 is connected to the drain electrode 66 both physically and electrically through the contact hole 76, and receives the image signal from the drain electrode. Even though the aperture ratio increases when the pixel electrode 82 overlaps the gate lines 22 or the adjacent the data lines 62, these lines are not required to overlap the pixel electrode. The pixel electrode 82 is connected to the conductor pattern 64 for storage capacitance through the contact hole 72 and transmits an image signal to the conductor pattern 64.

A redundant gate pad 86 and a redundant data pad 88 respectively connected to the gate pad 24 and the data pad 68 through the contact holes 74 and 78 are formed on the gate pad 24 and the data pad 68. These redundant pads 86 and 88 are optional as they protect the pads 24 and 68 and supplement the adhesiveness between an external circuit and the pads 24 and 68.

In this embodiment, transparent IZO is taken as an example of the material of the pixel electrode 82, but a transparent-conductive material made of polymer may also be used, and an opaque-conductive material may also be used in a reflective type liquid crystal display.

A manufacturing method of a thin film transistor array panel according to an embodiment of the present invention will now be described with reference to the FIGS. 11A to 18C and FIGS. 8 to 10.

Figure 11A:
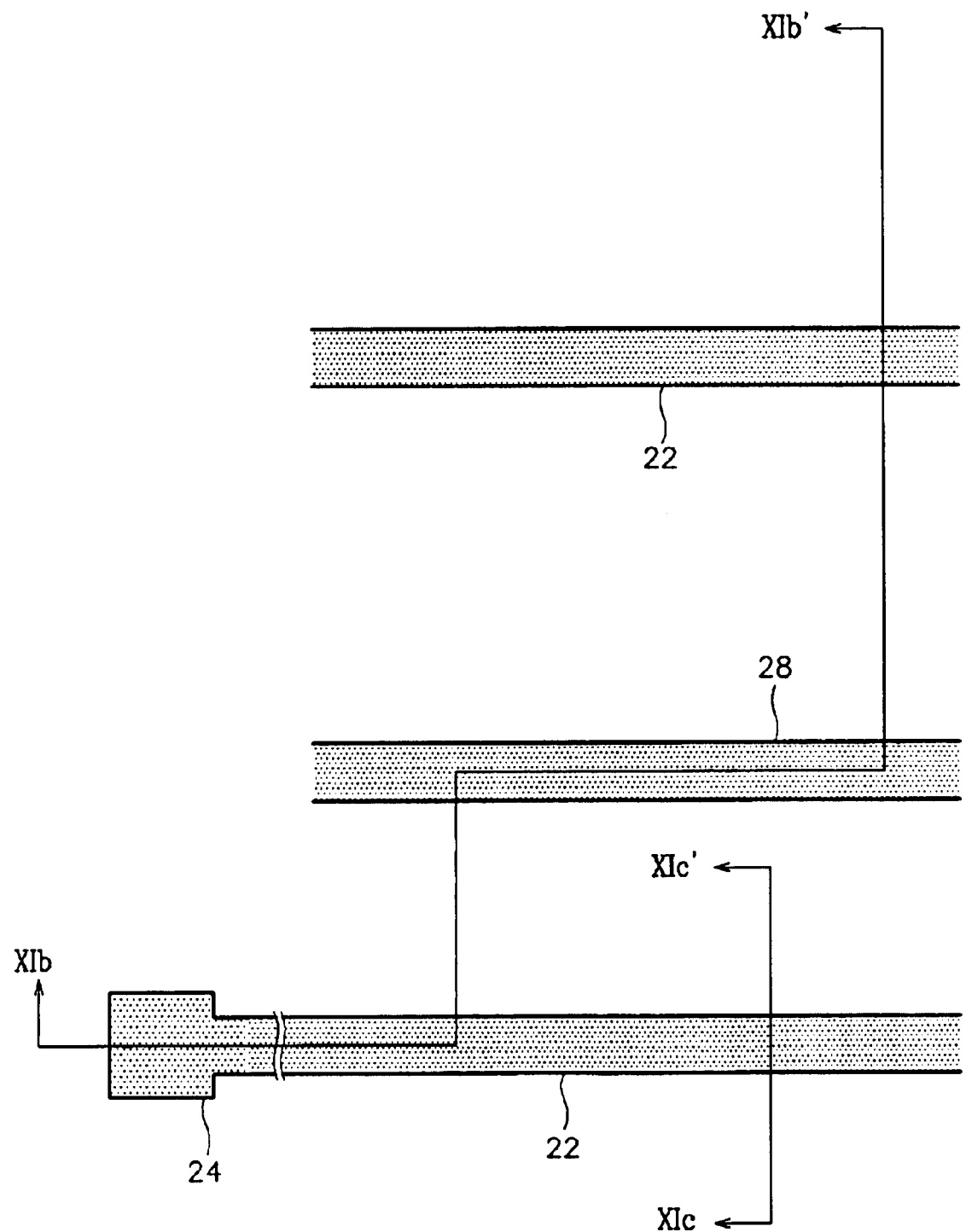
FIG. 11A is a layout view of the thin film transistor array panel according to the second embodiment of the present invention at a first manufacturing step of a manufacturing method.
Figure 11B:
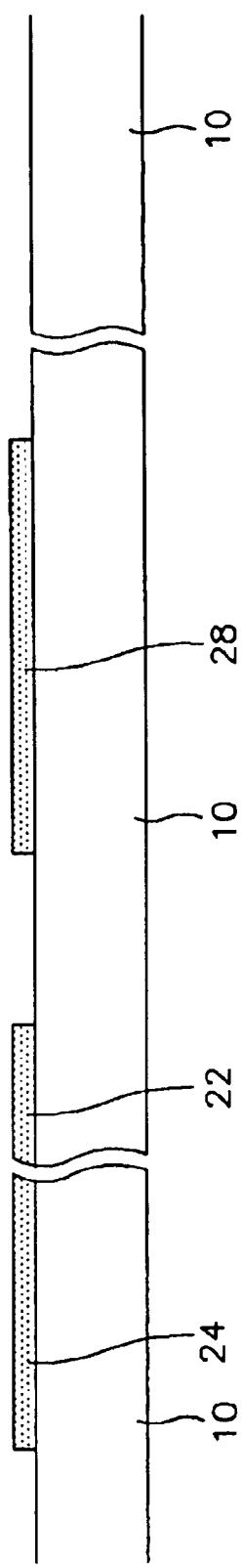
FIGS. 11B and 11C are cross-sectional views taken along the lines XIB–XIB' and XIC–XIC' of FIG. 11A.
Figure 11C:
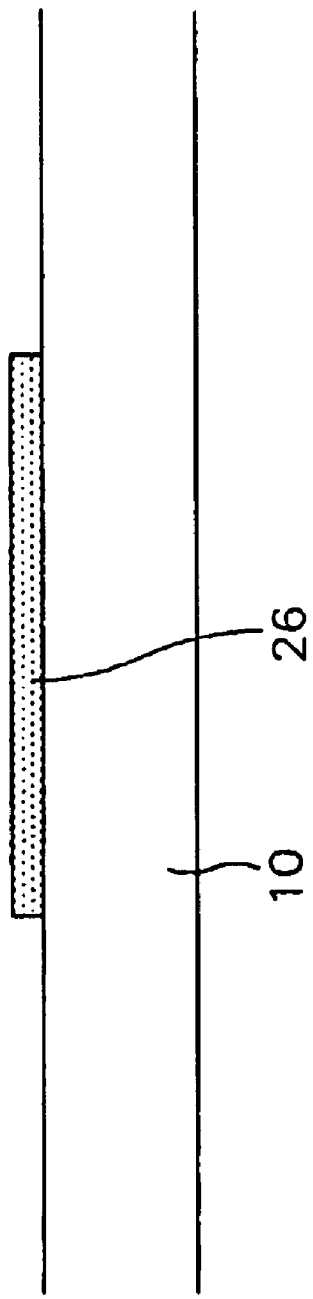

At first, as shown in FIGS. 11A to 11C, a metal layer of aluminum-based material, as the first embodiment, is deposited on a substrate 10 by such methods as sputtering, and gate wire parts including a gate line 22, a gate pad 24, a gate electrode 26, and a storage electrode 28 are formed by dry or wet etching using a first mask.

Figure 12A:
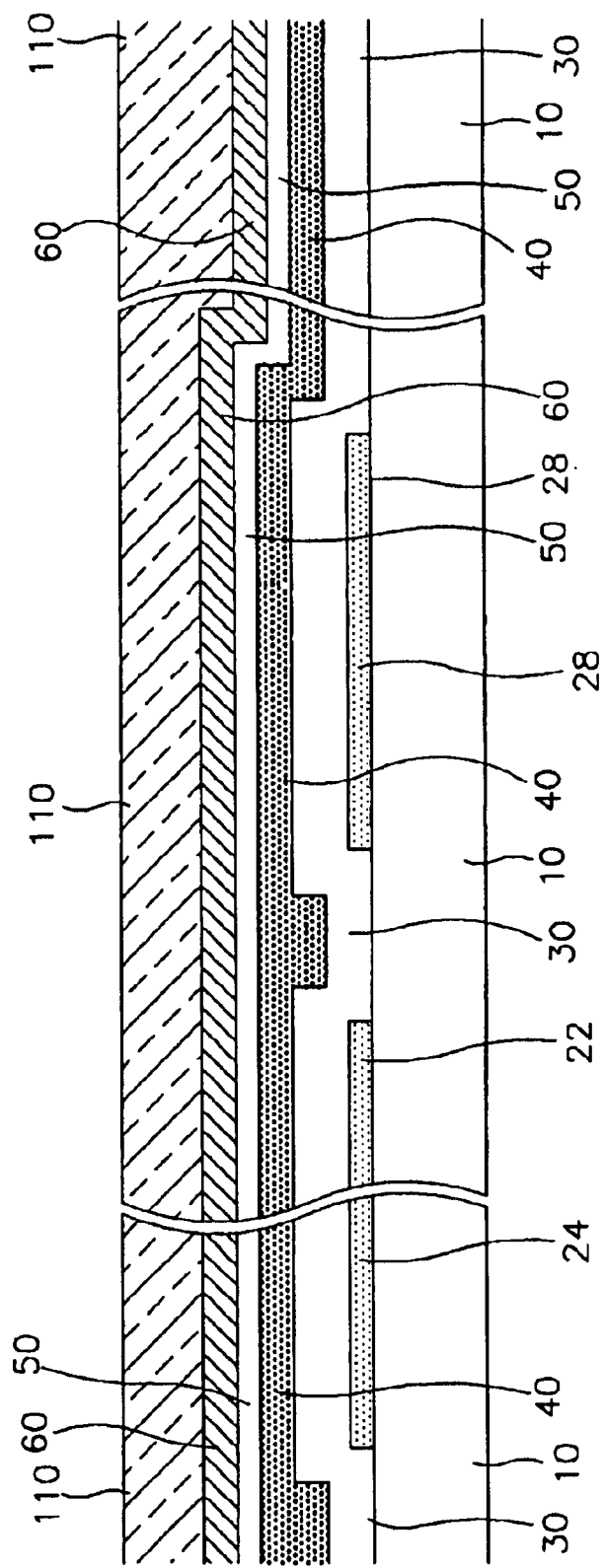
FIGS. 12A and 12B are cross-sectional views at the next manufacturing step following the step represented in FIGS. 11B and 11C taken along the lines XIB–XIB' and XIC–XIC' of FIG. 11A.
Figure 12B:
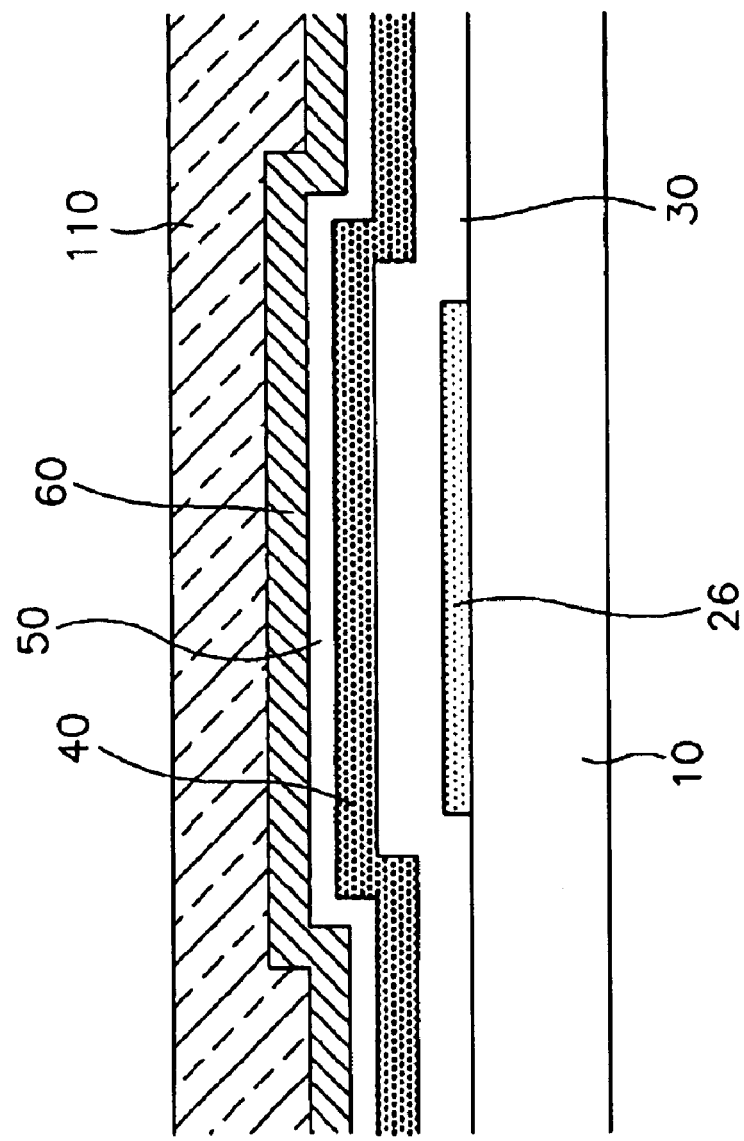

Next, as shown in FIGS. 12A and 12B, a gate insulating layer 30, a semiconductor layer 40, and an ohmic contact layer 50 are sequentially deposited to thicknesses of 1,500 Å to 5,000 Å, 500 Å to 2,000 Å, and 300 Å to 600 Å, respectively, by such methods as chemical vapor deposition (CVD). Then, a conductor layer 60, such as a metal, is deposited to a thickness of 1,500 Å to 3,000 Å by such methods as sputtering and a photoresist layer 110 having a thickness of 1 μm to 2 μm is coated on the conductive layer 60. Also, it is preferable that the gate insulating layer 30 is deposited at the temperature range of 250–400° C. Preferably, in this embodiment, the gate insulating layer 30 made of silicon-nitride is deposited at a temperature of about 300° C. to a thickness of about 4,500 Å.

Figure 13A:
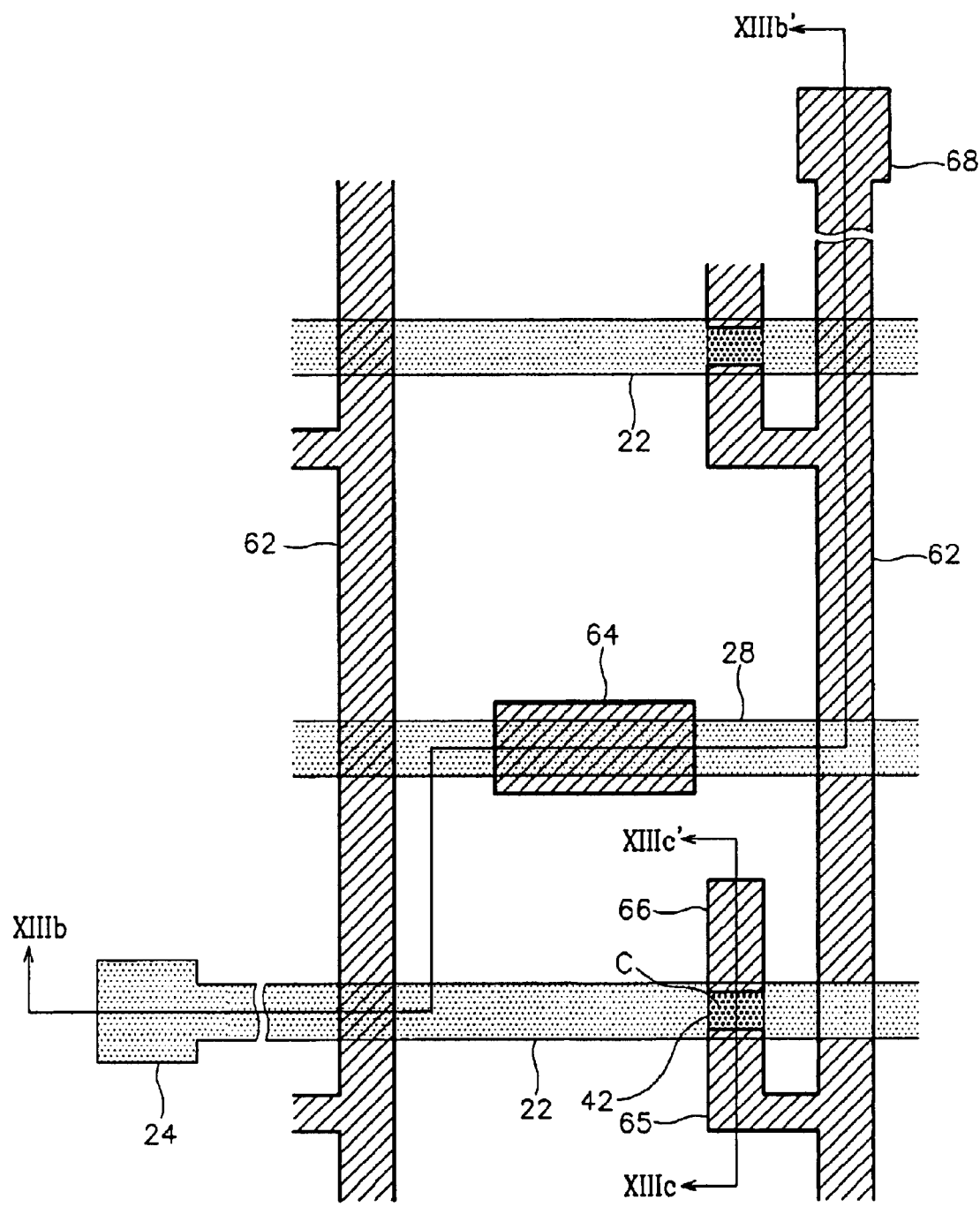
FIG. 13A is a layout view of a thin film transistor array panel in the next manufacturing step following the step represented in FIGS. 12A and 12B.
Figure 13B:
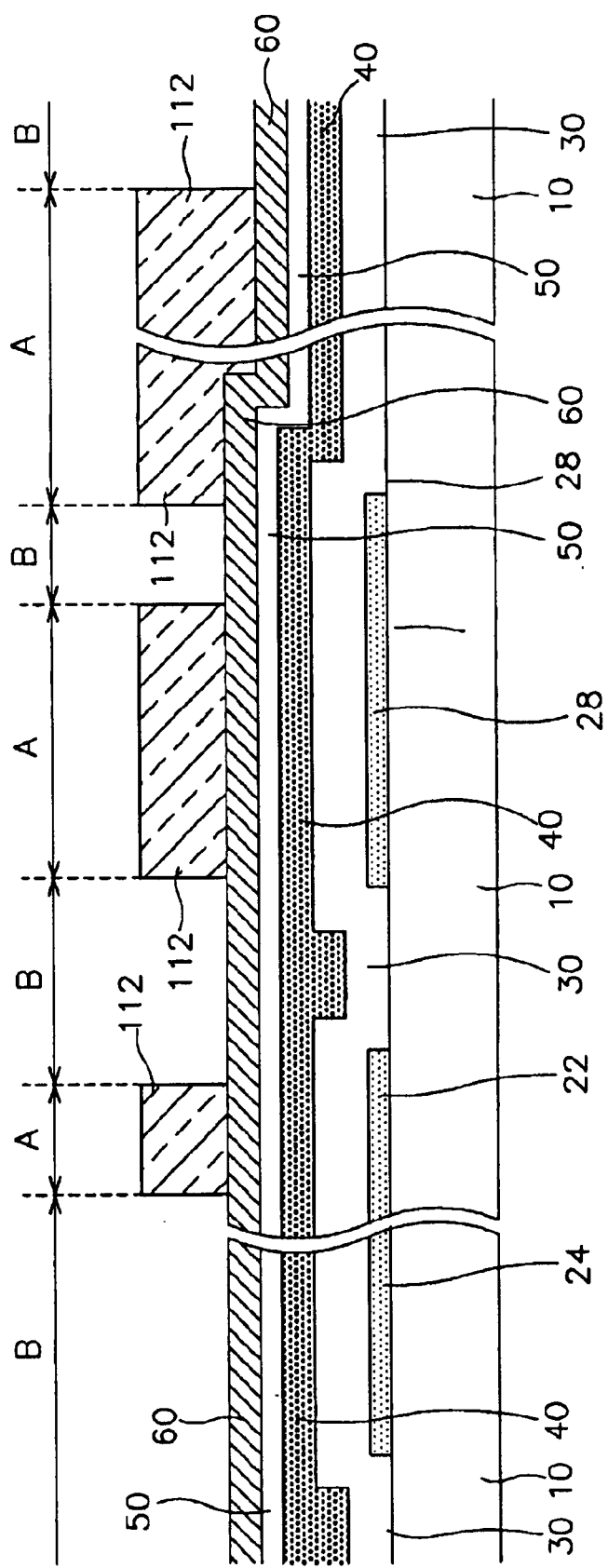

Thereafter, the photoresist layer 110 is exposed to light through a second mask and developed to form photoresist patterns 112 and 114 as shown in FIGS. 13B and 13C. At this time, the first portion 114 of the photoresist pattern located between a source electrode 65 and a drain electrode 66, i.e., a thin film transistor channel part C as shown in FIG. 13C, is thinner than the second portion 112 of photoresist pattern located over the data wire portion A where a data wire parts 62, 64, 65, 66, and 68 will be formed. Additionally, the third portion, or the remaining portion of the photoresist pattern located at portion B, is thinner than the first portion. The third portion may have a thickness that varies according to the etching method. For example, the third portion has substantially zero thickness when using a wet etch, but the third portion may have a non-zero thickness when using a dry etch. At this time, the thickness ratio between the first portion 114 and the second portion 112 depends on the etch conditions which will be described later. However, it is preferable that the thickness of the first portion 114 is equal to or less than half of that of the second portion 112, or for example, less than 4,000 Å.

There are many methods to change the thickness of the photoresist layer according to position, and it is possible to control the amount of incident light of A portion by forming a pattern such as a slit or a lattice, or by providing a partrially-transparent layer on the mask.

At this time, it is desirable that the size of the slit and the opaque portion between the slits are smaller than the resolution of the exposure device. When a partially-transparent layer is used, to reduce the amount of exposing light, a mask including films having different transmittances, or having a various thickness may be used.

When the photoresist layer is exposed to light through this mask, the polymers of the photoresist layer are disintegrated by the light. The exposure step is finished when the polymers of a portion, which is directly exposed to the light, are completely disintegrated. However, the polymers of the photoresist layer portion which are exposed through the slits pattern or partially-transparent layer are not completely disintegrated because the amount of incident light is less than that of the directly exposed portion. The polymers of the photoresist layer portion, which are not exposed to light by blocking layer, are hardly disintegrated. After developing the photoresist layers, the photoresist layer portion, which is hardly disintegrated, remains mostly, and a thinner portion remains under the portion that was exposed to a lesser amount of light than the portion that received full exposure. However, if the exposure time is too long, all the polymers of the photoresist layer are disintegrated. Therefore, such over exposure should be avoided.

The thinner portion 114 may be formed by forming a photoresist layer made of photosensitive and reflowable material, exposing the photoresist layer to light through a mask having respectively substantially transparent portions and substantially opaque portions to form a photoresist pattern having portions of zero and nonzero thicknesseses, and reflowing the photoresist to flow into the zero thickness portions to form a new photoresist pattern.

Referring back to FIG. 13C, the photoresist pattern 114 and the layers thereunder including the conductor layer 60, the ohmic contact layer 50, and the semiconductor layer 40 are next subject to an etching process. When this is done, a data wire and the layers thereunder at the data wire part A may be left, as well as only the semiconductor layer on the channel part C. In addition, three layers 60, 50, and 40 in the remaining part B are removed from the gate insulating layer 30.

Figure 14A:
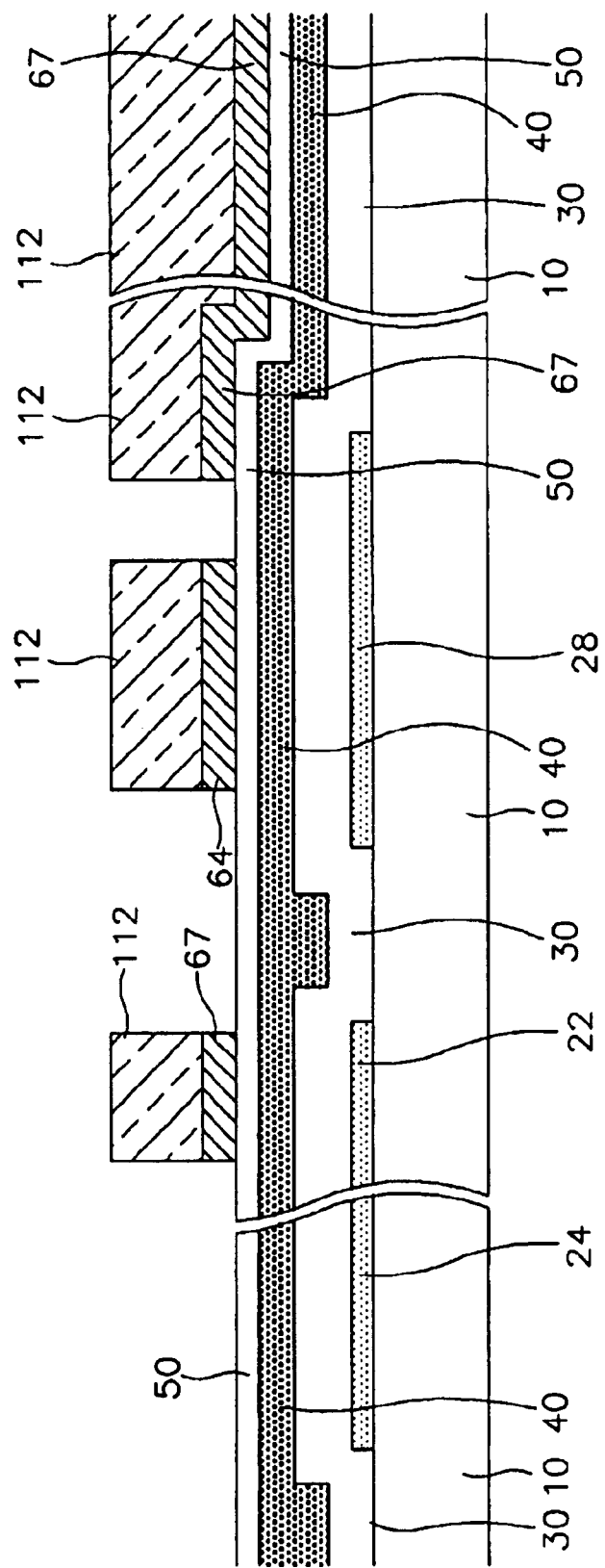
FIGS. 14A, 15A, and 16A are cross-sectional views in the next manufacturing step following the step represented in FIGS. 13B taken along the line XIIIB–XIIIB' of FIG. 13A.
Figure 14B:
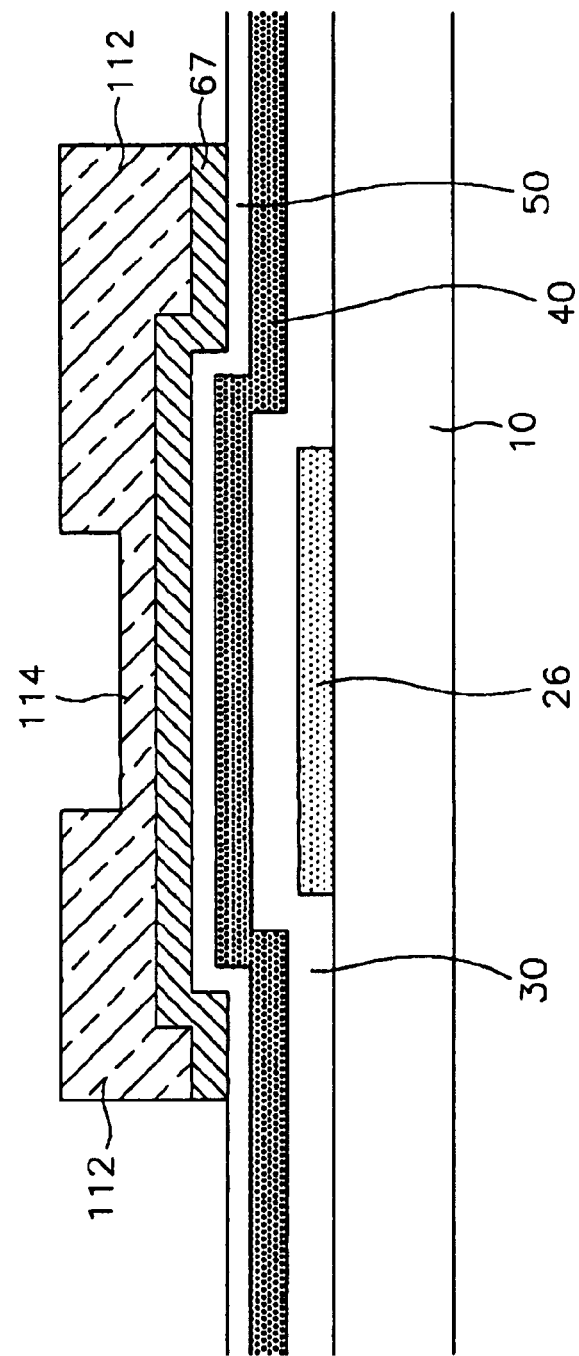
FIGS. 14B, 15B, and 16B are cross-sectional views in the next manufacturing step following the step represented in FIG. 13C taken along the line XIIIC–XIIIC' of FIG. 13A.

As shown in FIGS. 14A and 14B, the ohmic contact layer 50 of the part B is exposed by removing the conductor layer 60 thereon. At this time, both wet and dry etch can be used, and it is preferable that only the conductor layer 60 is etched but the photoresist layers 112 and 114 are not etched. However, since the dry etch method is hard achieve this condition, the photoresist patterns 112 and 114 may also be etched. In this case, the first portion 114 may be made thicker than in the wet etch case so that the conductor layer 60 is not exposed.

If the conductor layer 60 is made of Mo or MoW alloy, Al or Al alloy, or Ta, both dry or wet etch methods can be used. However, if the conductor layer 60 is made of Cr, a wet etch is better because Cr is not easily removed by dry etch. $CeNHO_3$ is available as a wet etchant for etching a Cr conductor layer 60. The gas mixture of $CF_4$ and HCl or $CF_4$ and $O_2$ is available for dry etching a Mo or MoW conductor layer 60, and in this case, the etch rate of the latter system on the photoresist layer is similar to that of the conductor layer 60.

Referring to FIGS. 14A and 14B, as a result, only the portions of the conductor 67 and 64 under the photoresist layers 112 and 114 at the channel part C and the data wire part B for source/drain electrodes and a storage capacitor are left, and the remaining portion of the conductor layer 60 at part B is wholly removed to expose the ohmic contact layer 50 thereunder. At this time, the conductor patterns 67 and 64 have the same layout as the data wire parts 62, 64, 65, 66, and 68 except that the source electrode 65 and the drain electrode 66 are connected to each other. When a dry etch is used, the photoresist layers 112 and 114 are also etched to a certain thickness.

Figure 15A:
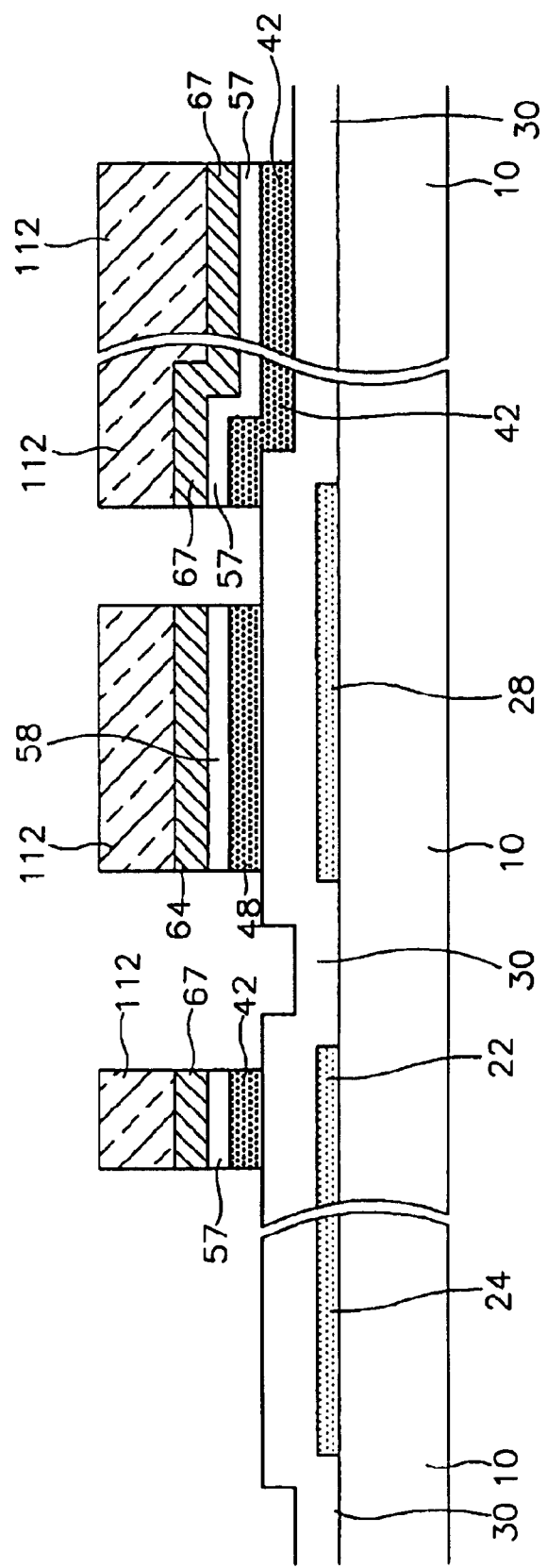
Figure 15B:
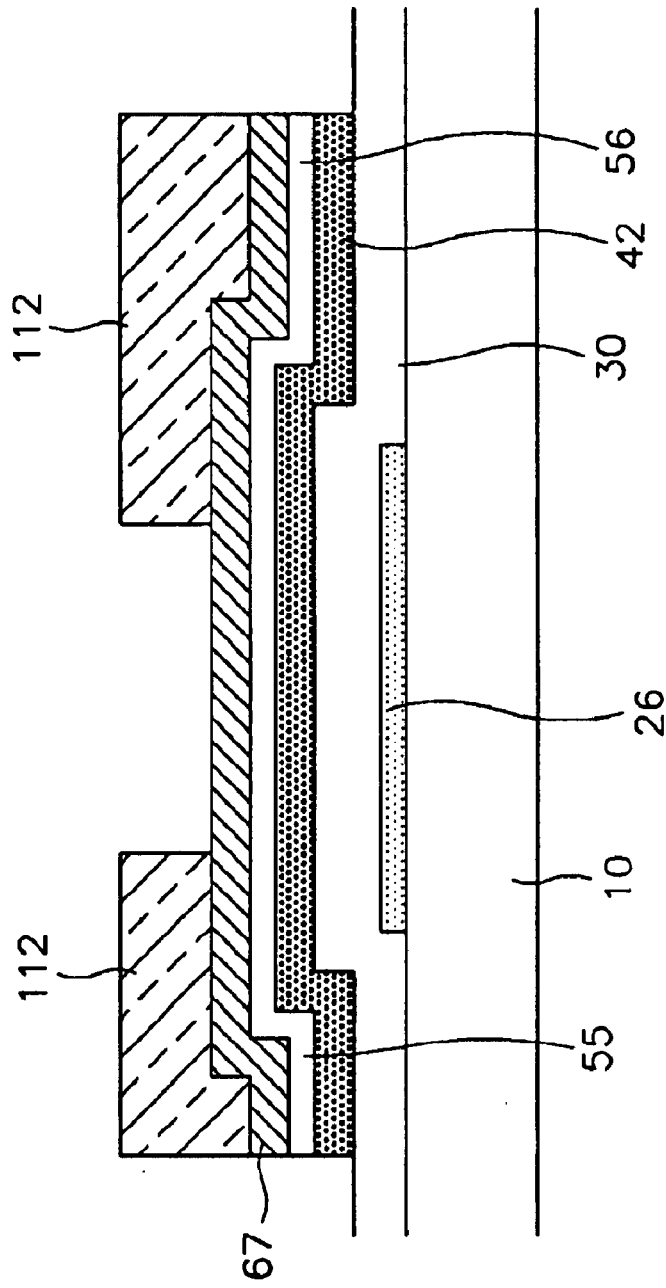
Figure 16A:
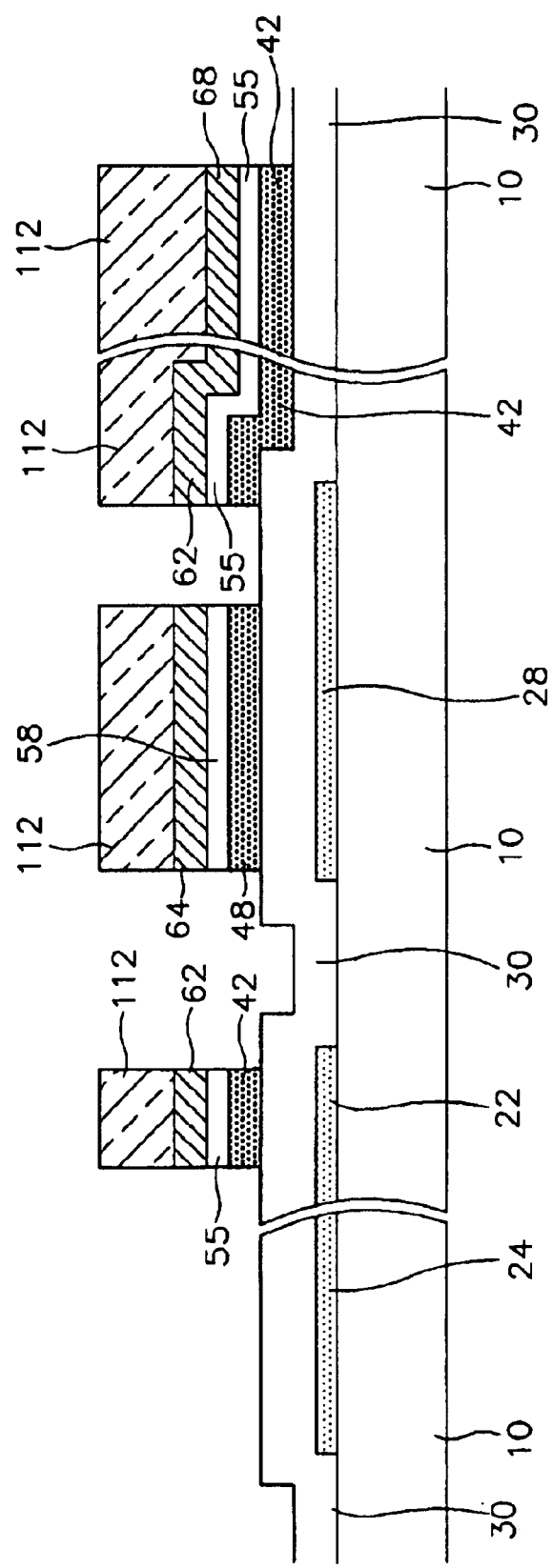
Figure 16B:
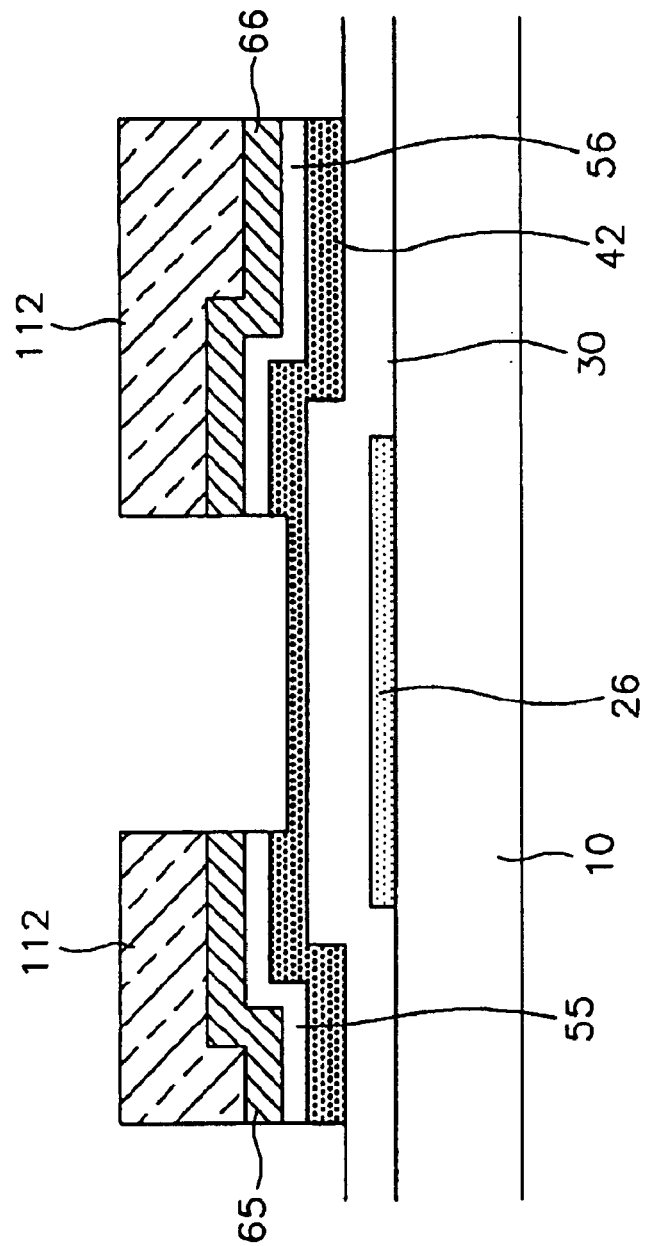

Next, the exposed portions of the ohmic conductor layer 50 at part B, and the semiconductor layer 40 thereunder of FIGS. 14A and 14B are removed by dry etching along with first portion 114 of the photoresist layer, as shown FIGS. 15A and 15B. The etch condition may be such that the photoresist patterns 112 and 114, the ohmic contact layer 50 and the semiconductor layer 40 are all etched (the semiconductor layer and the ohmic contact layer have almost the same etch rate), but the gate insulating layer 30 must be not etched. It is preferable that the etch rates of the photoresist patterns 112 and 114 and the semiconductor layer 40 are almost the same. This occurs, for example, with the gas mixture of $SF_6$ and HCl or $SF_6$ and $O_2$. At this time, if the etch rates of the photoresist patterns 112 and 114, the semiconductor layer 40 are almost the same, the thickness of the first portion 114 is equal to or less than that of the sum of the semiconductor layer 40, and the ohmic contact layer 50. Then, as shown in FIGS. 15A and 15B, the conductor pattern 67 is exposed by removing the first portion 114 of the channel part C, and the gate insulating layer 30 are exposed by removing the ohmic contact layer 50, and the semiconductor layer 40 of the part B shown in FIG. 15B. At the same time, the thickness of the second portion 112 over the data wire part A is reduced by etching. Furthermore, the completed semiconductor patterns 42 and 48 are obtained at this step. The reference numerals 57 and 58 respectively represent the ohmic contact layer pattern under the conductor patterns 67 and 64 for the source/drain the electrode and the storage capacitor.

The remaining photoresist layer on the conductor pattern 67 is then removed by ashing or plasma etching.

Next, as shown in 16A and 16B, the conductor pattern 67 for source/drain electrodes at the channel part C and the ohmic contact layer pattern 57 for source/drain electrodes of FIG. 14B are removed by etching. At this time, it is possible either to etch both the conductor pattern 67 and the ohmic contact layer 57 by a dry etching method, or to etch the conductor pattern 67 by a wet etching method and the ohmic contact layer 57 by a dry etching method. It is preferable in the former case that etch conditions having a large etch selectivity between the conductor pattern 67 and the ohmic contact layer pattern 57 are employed. This is because if the etch selectivity is not large enough, it is hard to detect the end point of the etch and to control the thickness of the semiconductor pattern 42 around the channel part C. This can be achieved by using a gas mixture of $SF_6$ and $O_2$, for example. In the latter case of doing the wet etch and the dry etch sequentially, the lateral sides of the conductor pattern 67 subject to wet etch are also etched although those of the ohmic contact layer pattern 57, which is dry etched, are hardly etched at all. Thereby, the profile of these two patterns 67 and 57 makes a step like form. The gas mixture of $CF_4$ and $O_2$, or $CF_4$ and HCl are examples of an etch gas system for etching the ohmic contact layer pattern 57 and the semiconductor pattern 42. The semiconductor pattern 42 may also be formed to have a uniform thickness by etching with the gas mixture of $CF_4$ and $O_2$. At this time, as shown in FIG. 15B, the thickness of the semiconductor pattern 42 may be reduced and the second portion 112 of the photoresist pattern is also etched to a certain thickness. The etch conditions may also be set not to etch the gate insulating layer 30, and it is preferable to make the photoresist pattern thick enough not to expose the data wire parts 62, 64, 65, 66, and 68.

As a result, the source electrode 65 and the drain electrode 66 are divided, and the completed data wire parts 62, 64, 65, 66, and 68 and the completed contact layer pattern 55, 56, and 58 thereunder are obtained.

Next, the remaining second portion 112 of the photoresist layer on the data wire (Region A of FIG. 13C) is removed. However, this removal of the second portion 112 may be performed after the step of removing the conductor pattern 67 for source/drain electrodes on the channel part C of FIG. 15B and before the step of removing the ohmic contact layer pattern 57 under the conductor pattern 67.

To summarize, this process can be done by using both wet etching and dry etching in turn, or by using only dry etching.

In the former case, the conductor layer of the part B is first removed by wet etching, and then the ohmic contact layer and the semiconductor layer thereunder are removed by dry etching. At this time, the photoresist layer of the part C is consumed to a certain thickness, and the part C may have or may not have any residual photoresist left, which substantially depends on the initial thickness of the photoresist layer of the part C. When the part C has residual photoresist left, this residual photoresist is removed by ashing. Finally, the conductor layer of the part C is wet etched to separate the source electrode and the drain electrode, and the ohmic contact layer of the part C is removed by using dry etching.

In the latter case, the conductor layer, the ohmic contact layer, and the semiconductor layer of the part B are removed by dry etching. As in the former case, the part C may have or may not have residual photoresist left, and residual photoresist is removed by ashing when part C does have any residual photoresist. Finally, the conductor layer of the part C is dry etched to separate the source and the drain electrodes, and the ohmic contact layer of the part C is removed by using dry etching.

Also, if the data wire is etched, the semiconductor pattern, the contact layer pattern, and the data wire may be completed with the same step at once. That is to say, it is desirable that the photoresist pattern 114 and the contact layer 50 thereunder of the part C are dry etched, and the portion of the photoresist pattern 112 of the part A is dry etched during the dry etching of the conductor layer, the ohmic contact layer, and the semiconductor layer of the part B.

Since the latter process uses only one type of etching method, it is simpler, although it is harder to achieve proper etching conditions. On the other hand, the former process has the advantage of easily achieving proper etching condition, although it is more complicated.

Figure 17A:
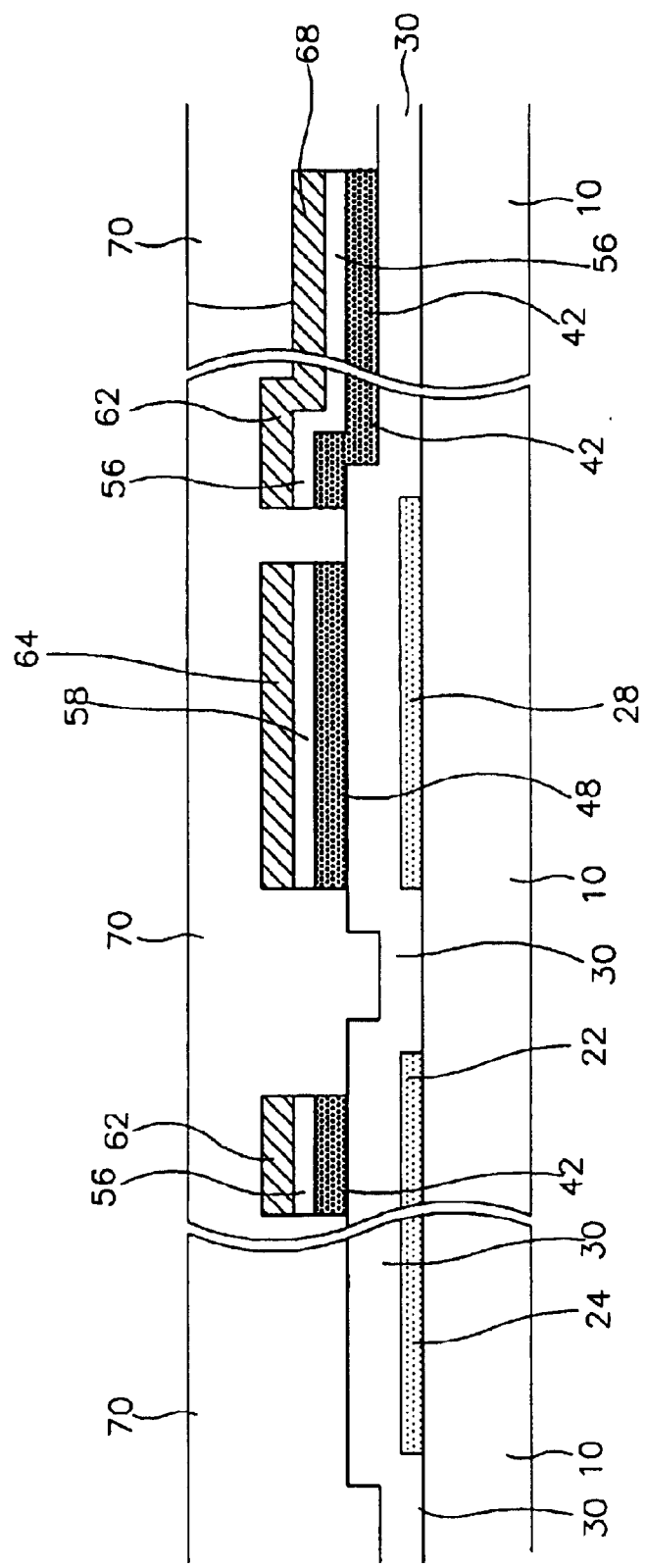
FIGS. 17A and 17B are layout views of a thin film transistor array panel in the next manufacturing step following the step represented in FIGS. 16A and 16B.
Figure 17B:
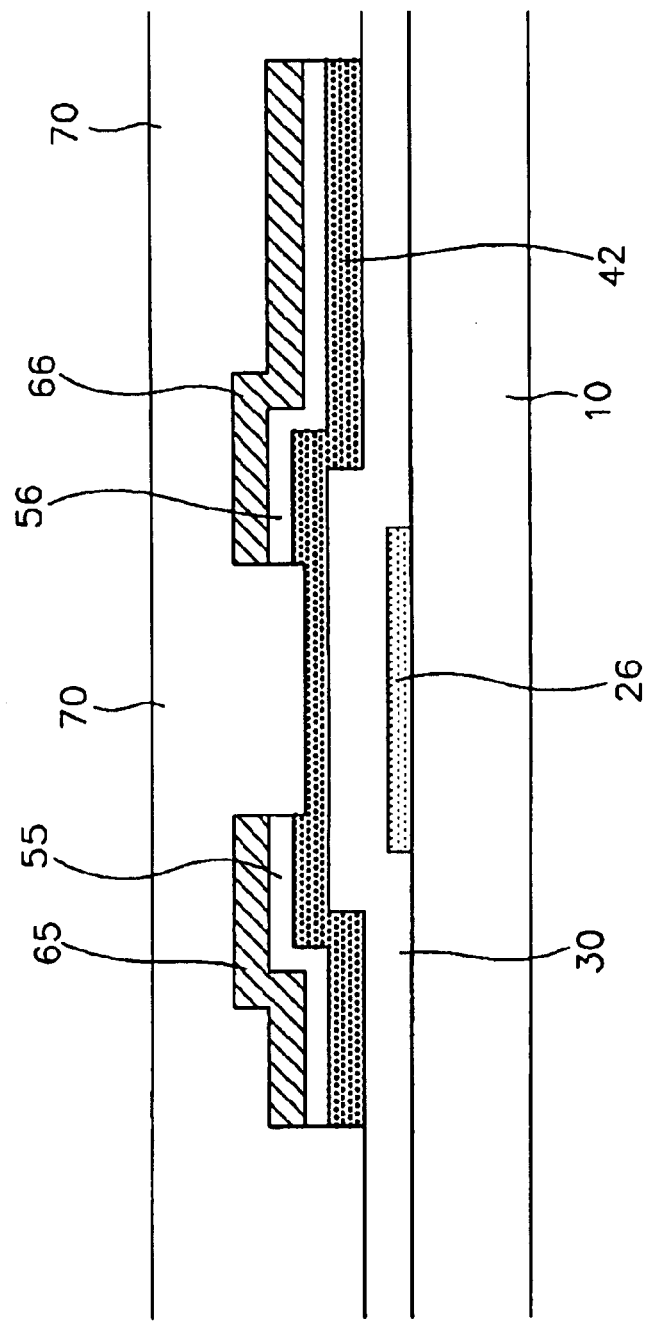

After forming data wire parts 62, 64, 65, 66, and 68 by the above steps, a passivation layer 70 is formed by such methods as chemical vapor deposition (CVD), as shown in FIGS. 17A and 17E. At this time, it is also preferable that the passivation layer 70 is deposited at the temperature range of 250–400° C. Then, annealing step as a thermal treatment process is executed at the temperature range of 280–400° C. to remove a residual layer formed on the gate wire 22, 24, 26 and 28, and the data wire 62, 64, 65, 66 and 68, like the first embodiment. Also, the cleaning described in the first embodiment may be executed to remove organic material and residual material before depositing the passivation layer 70.

Figure 18A:
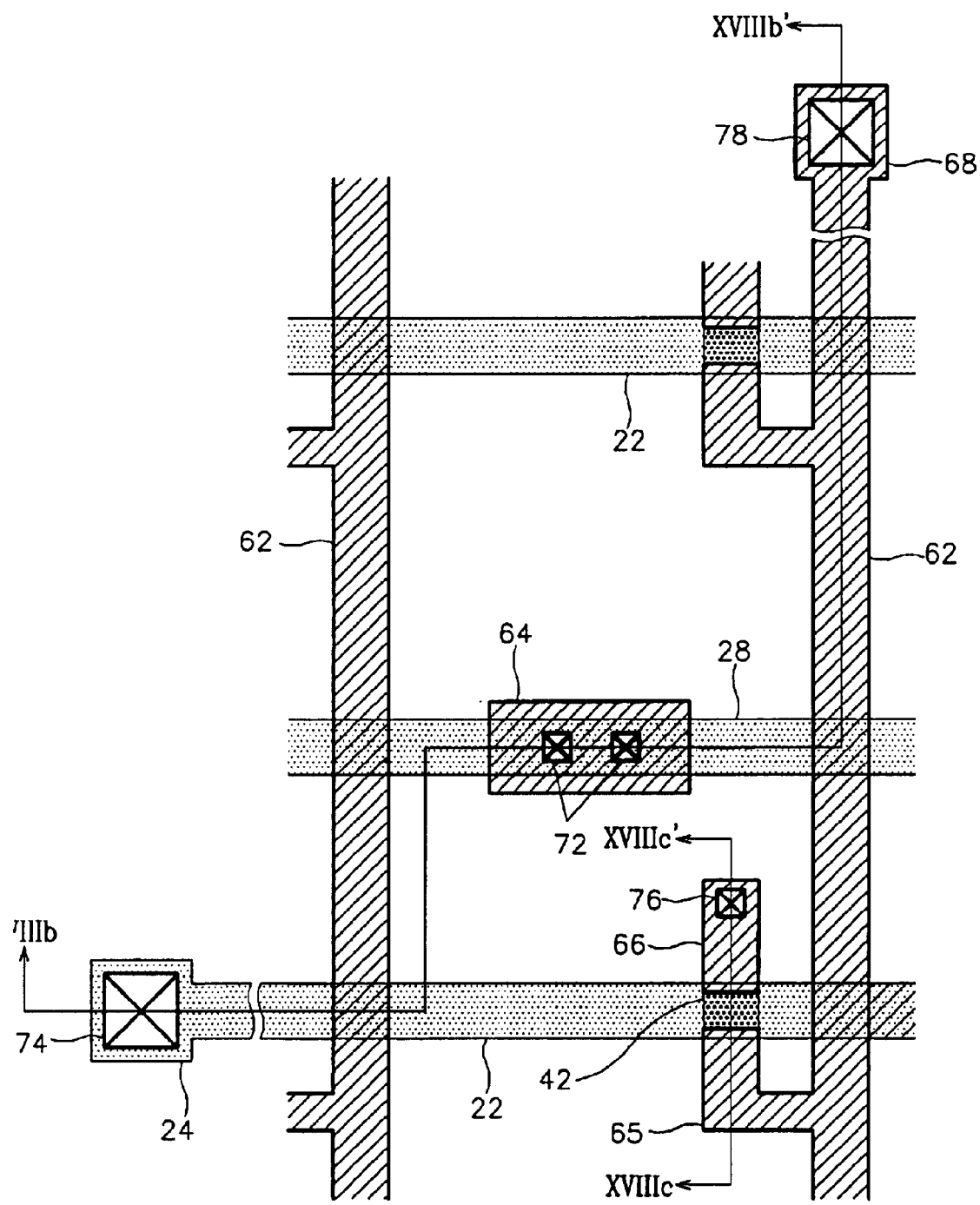
FIG. 18A is a layout view of a thin film transistor array panel in the next manufacturing step following that represented in FIGS. 17A and 17B.
Figure 18B:
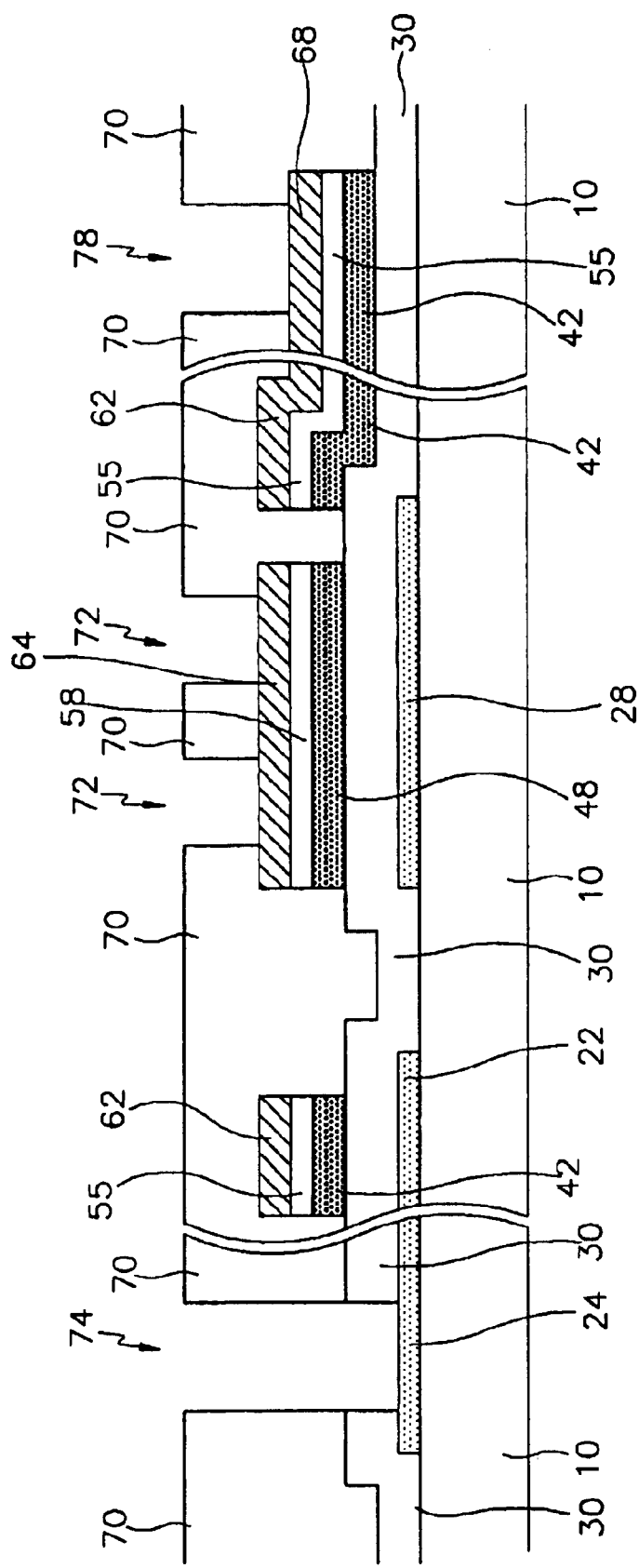
FIGS. 18B and 18C are the cross-sectional views taken along the lines XVIIIB–XVIIIB' and XVIIIC–XVIIIC' of FIG. 18A, respectively.
Figure 18C:
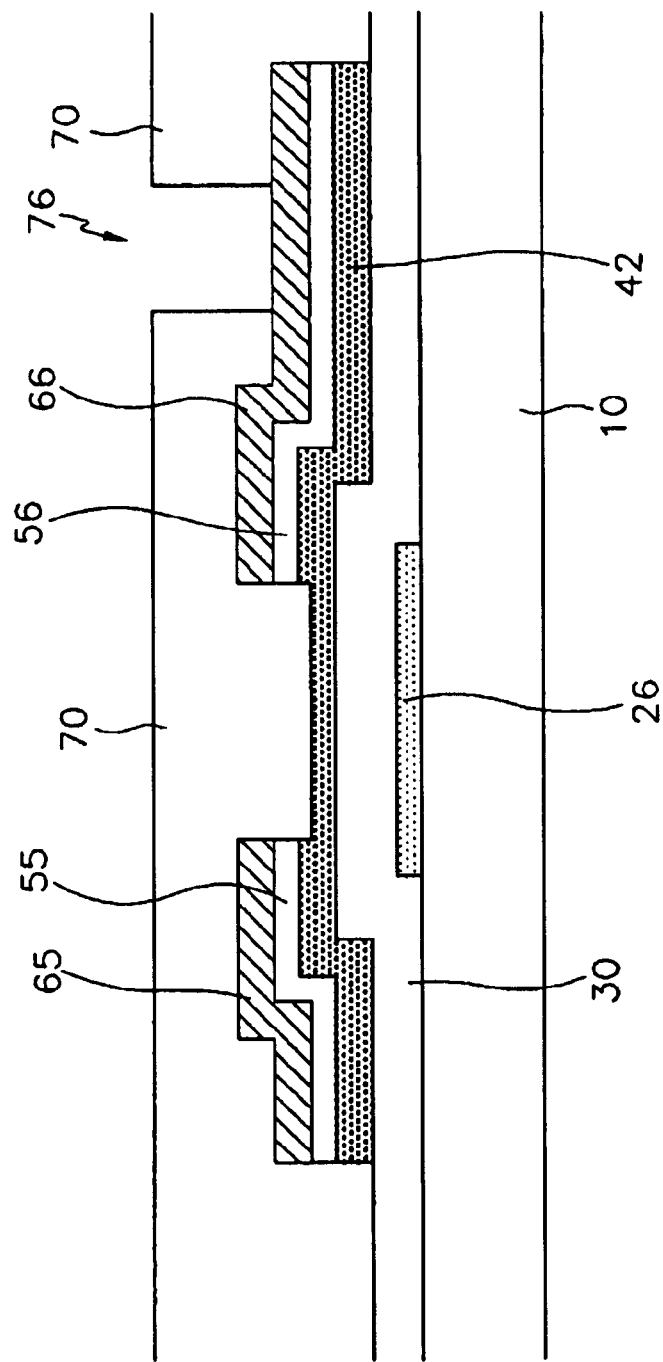

Next, as the first embodiment, the passivation layer 70 is patterned along the gate insulating layer 30 through photolithography processes using a mask to form contact holes 76, 74, 78 and 72 exposing respectively the drain electrode 66, the gate pad 24, the data pad 68, and the conductor pattern 64 for the storage capacitor, as shown in FIGS. 18A to 18C.

Next, as shown in FIGS. 8 to 10, a IZO layer is deposited to a thickness of 400 Å to 500 Å, and etched by using a mask to form a pixel electrode 82 electrically connected to the drain electrode 66 and the conductor pattern 64, a redundant gate pad 86 electrically connected to the gate pad 24, and a redundant data pad 86 electrically connected to the data pad 68, as the first embodiment, respectively. At this time, the etchant to etch the IZO of the pixel electrode 82, the redundant gate pad 86, and the redundant data pad 88 is Cr etchant for chromium metal. Since the Cr etchant does not corrode the metal of aluminum-based material, it is possible to prevent the metal of aluminum-based material from corroding in the portion of the contact structure. $HNO_3/(NH_4)_2Ce(NO_3)_6/H_2O$ is example of the etchant. In this embodiment according the present invention, to minimize contact resistance of contact portion, it is preferable that the IZO layer is deposited at the temperature range of less than 250° C.

In the second embodiment having the same effects as that of the first embodiment, by forming the data wire parts 62, 64, 65, 66, and 68, the ohmic contact layer pattern 55, 56, and 58, and the semiconductor patterns 42 and 48 through one photolithography process, the manufacturing method of the thin film transistor array panel may be also simplified.

As above-described, the effects that the residual layer formed on the metal layer made of aluminum-based material in the manufacturing method according to the present invention is removed by annealing will be described with the reference of FIGS. 19 and 20.

Figure 19:
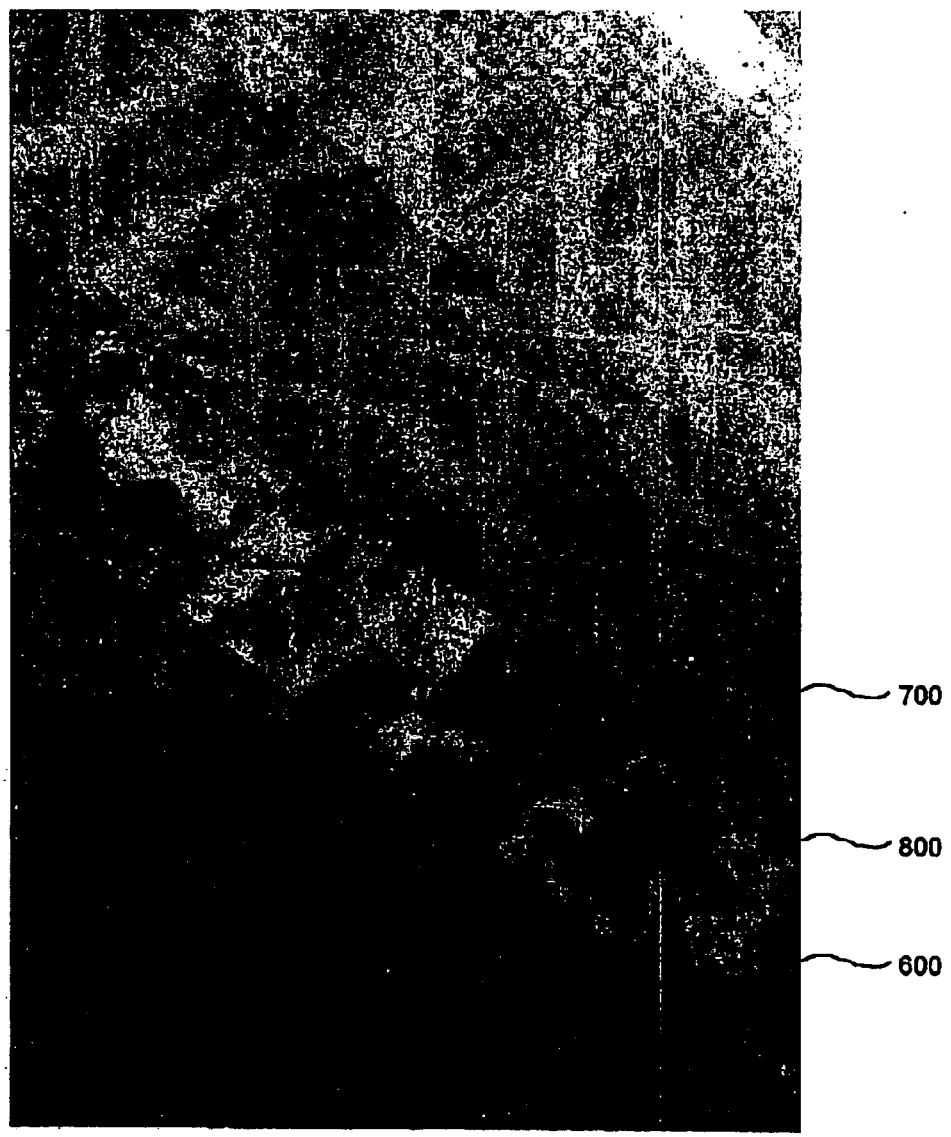
FIGS. 19 and 20 are photographs taken by TEM (transmission electron microscope), that show metal layers of Al—Nd according to whether annealing step is executed or not in a method for manufacturing a thin film transistor array panel according to an embodiment of the present invention.
Figure 20:
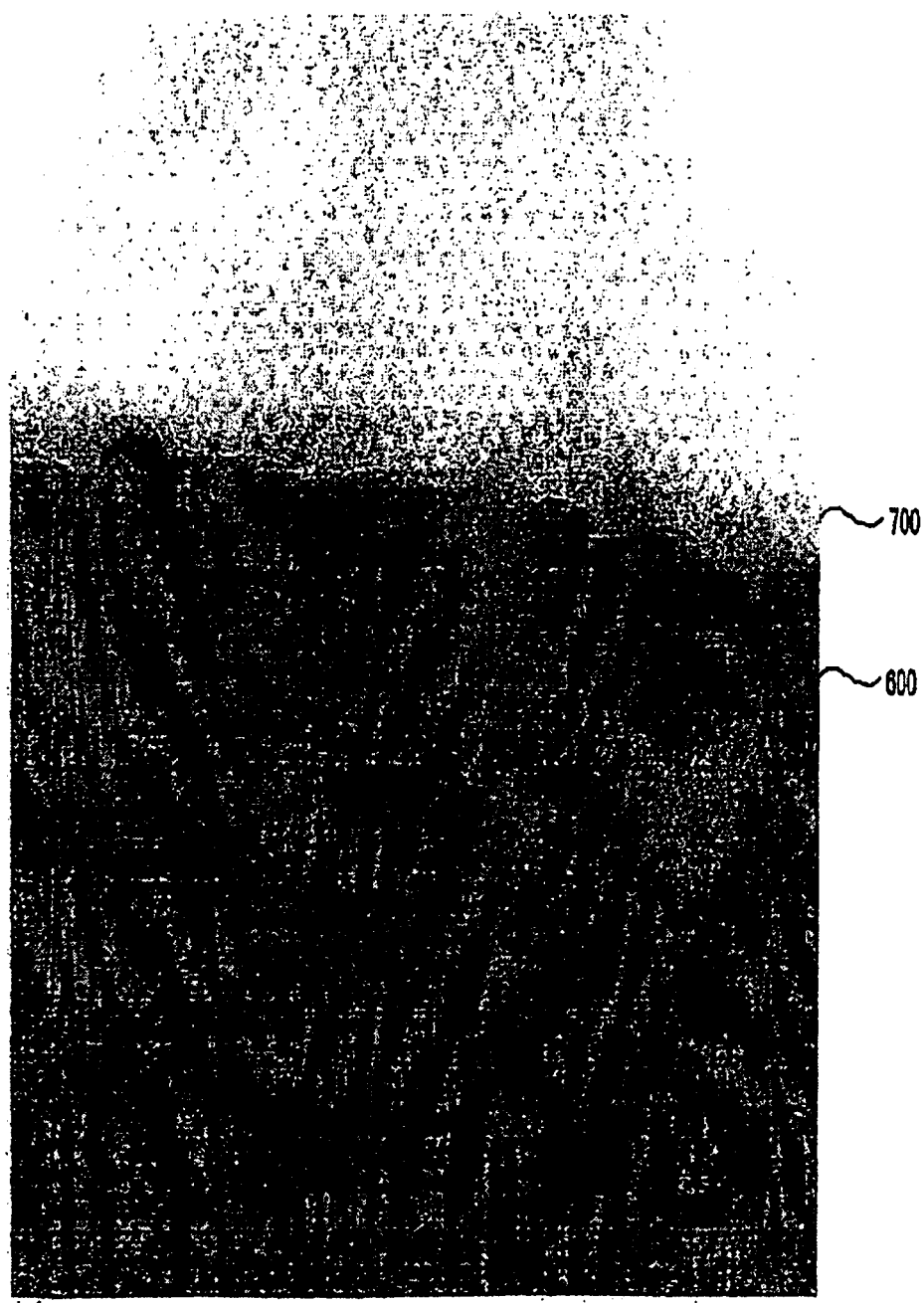

FIGS. 19 and 20 are photographs taken by TEM (transmission electron microscope), that show metal layers of Al—Nd according to whether annealing step is executed or not in manufacturing a thin film transistor array panel according to an embodiment of the present invention. FIG. 19 is the case without an annealing step, and FIG. 20 is the case with an annealing step.

In FIGS. 19 and 20, a metal layer 600 is deposited to a thickness of about 2,500 Å by sputtering a target of Al—Nd alloy including 2 at % of Nd at a temperature of about 150° C., and a passivation layer 700 made of silicon-nitride and covering the metal layer 60 is formed at a temperature of about 300° C. The annealing step is executed at a temperature of about 300° C. for about 30 minute in FIG. 20.

As shown in FIG. 19, the residual layer 800 including $Al_2O_3$ is formed on the metal layer 600 of aluminum-based material without an annealing step. The residual layer is removed in the case of executing the annealing step. Accordingly, by executing the annealing step in these embodiments, the metal layer made of aluminum-based material and IZO layer contact each other, and the contact resistance of them is minimized.

On the other hand, the surfaces of the metal layers made of aluminum-based material formed in the manufacturing method according the present invention will be described with the reference of FIGS. 21A to 21C.

Figure 21A:
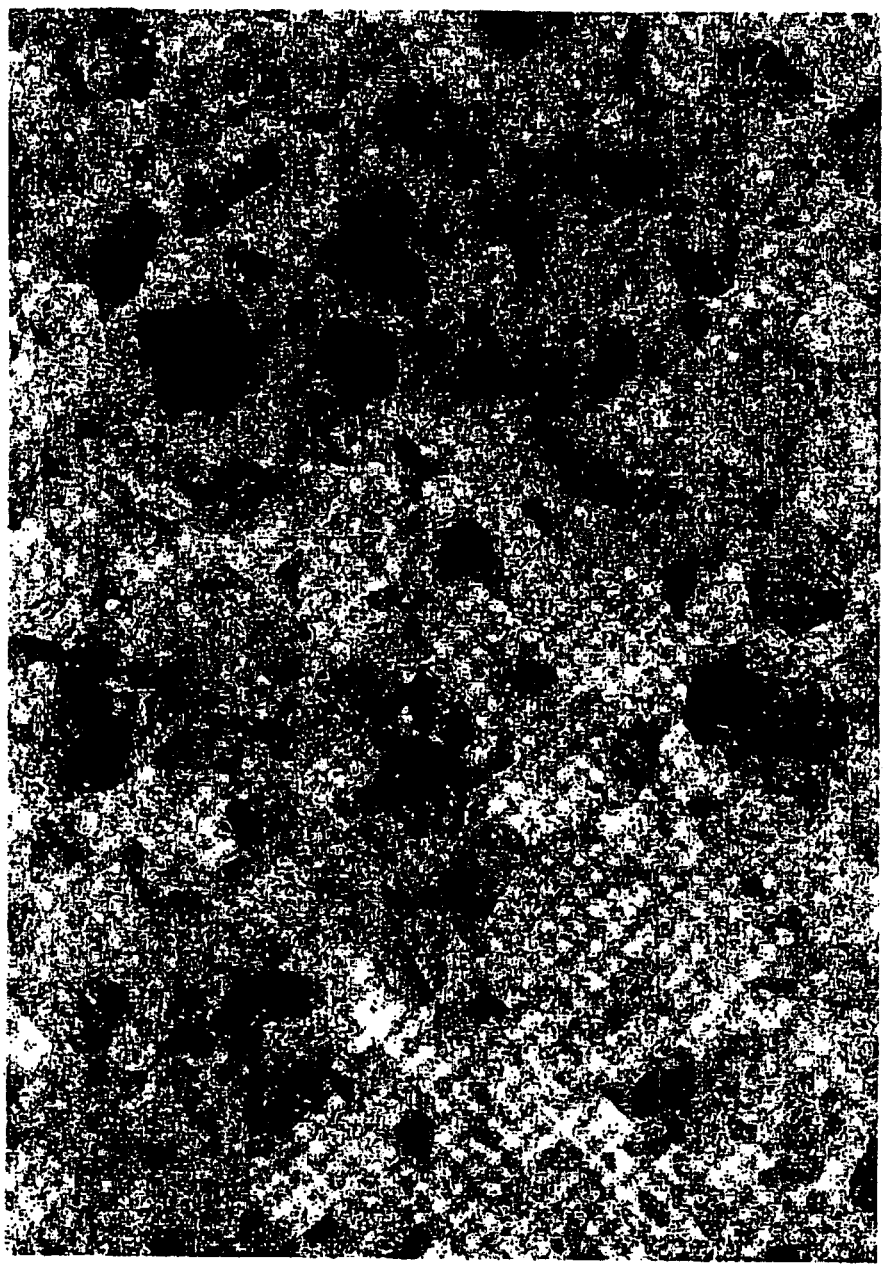
FIGS. 21A to 21C are photographs taken by TEM (transmission electron microscope), that show surfaces of metal layers made of Al—Nd in a method for manufacturing a thin film transistor array panel according to an embodiment of the present invention, respectively.
Figure 21B:
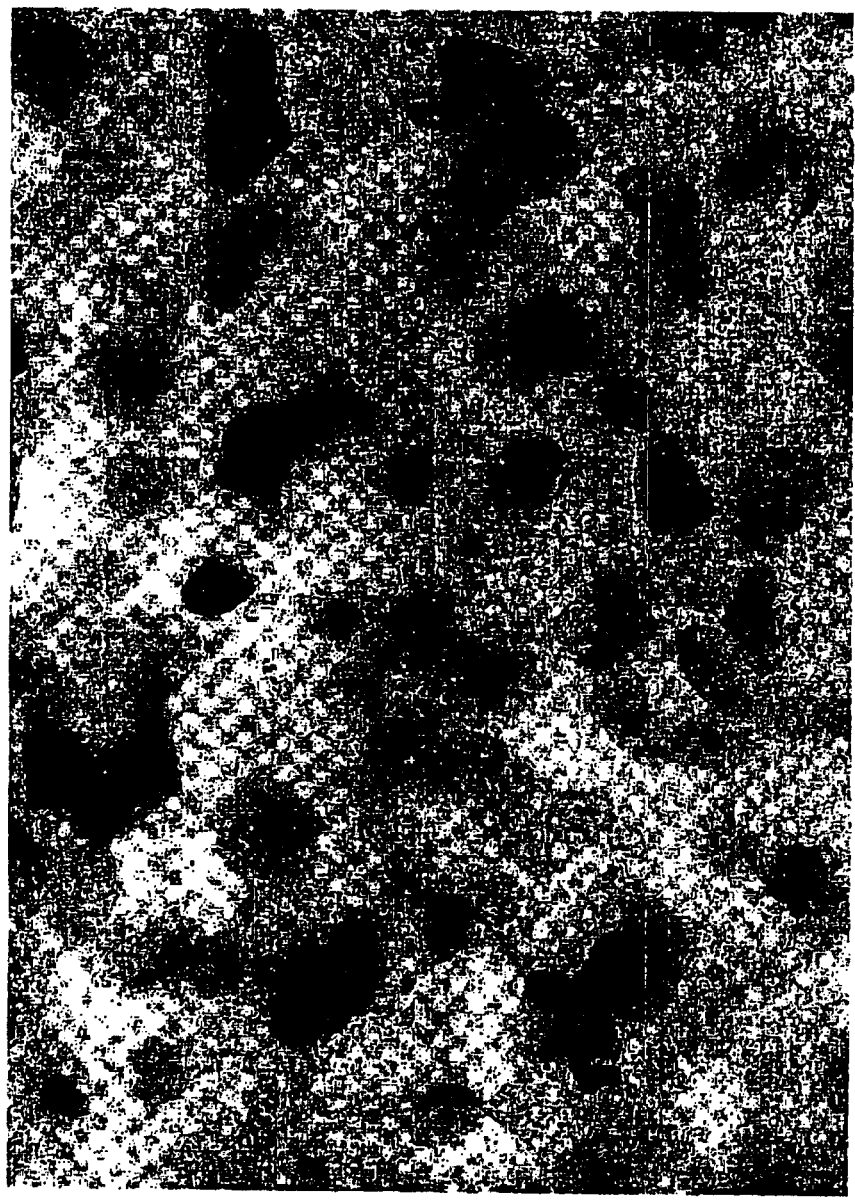
Figure 21C:
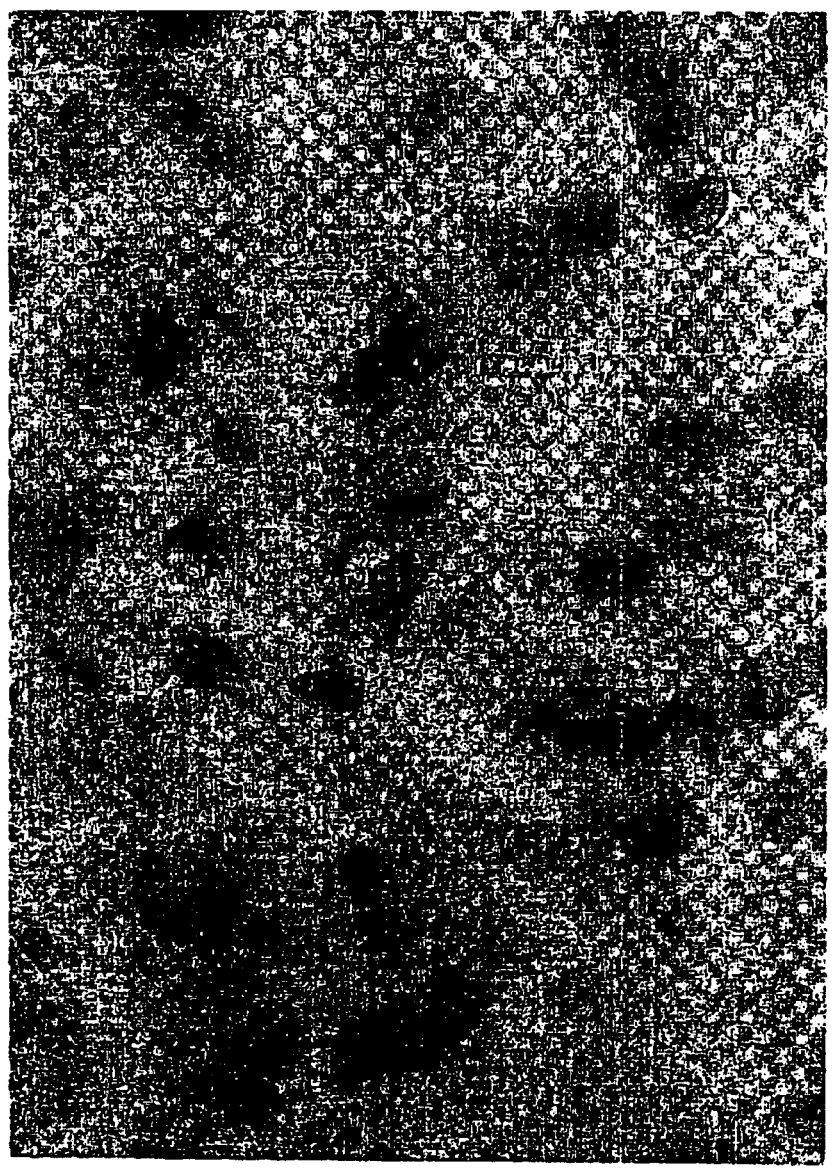

FIGS. 21A to 21C are photographs taken by TEM (transmission electron microscope), that show surfaces of metal layers made of Al—Nd in a method for manufacturing a thin film transistor array panel according to an embodiment of the present invention.

FIG. 21A shows the surface of an Al—Nd layer deposited to a thickness of about 2,500 Å by sputtering a target of Al—Nd alloy including 2 at % of Nd at a temperature of about 150° C. FIG. 21B shows the surface of the Al—Nd after depositing a passivation layer made of silicon-nitride at a temperature of about 300° C. on Al—Nd layer of FIG. 21A and removing the passivation layer. FIG. 21C shows the surface of the Al—Nd after depositing a passivation layer made of silicon-nitride with the same condition as that of FIG. 21B, executing the annealing step at a temperature of about 300° C. and removing the passivation layer.

As shown FIGS. 21A to 21C, if the passivation layer is formed and the annealing step is executed, the grain size of Al—Nd increases.

To measure a contact resistance of a contact portion including the contact holes 72, 74, 76 and 78 in the first embodiment and the second embodiment, a plurality of measuring patterns including a plurality of metal layer with the same layer as the gate wire 22, 24, 26 and 28, and/or the data wire 62, 64, 65, 66 and 68, a plurality of contact holes of the passivation layer 70, exposing the metal layer, and a plurality of IZO layer with the same layer as the pixel electrode 82 were formed in series according to the order of the manufacturing method of the present invention. Here, the whole contact resistance of the contact portion of two hundred pieces contact holes was measured. At this time, it is desirable that the whole contact resistance is less than $E^7$ Ω. In the case of executing the annealing step as these embodiments, the whole contact resistance less than $E^7$ Ω could be obtained even when sizes of the contact holes were reduced to 4 μm*4 μm. At this time, it is preferable that the contact hole exposing the drain electrode 76 (referring to the first and the second embodiments) is less than 10 μm*10 μm with the consideration of the aperture ratio of pixel.

Furthermore, the thermal treatment process is executed after forming the passivation layer 70 in the manufacturing method of the first and the second embodiments according the present invention, therefore a thermal treatment process to improve characteristics of thin film transistors after completing the thin film transistor array panel may be omitted.

In the embodiments according the present invention, by executing the annealing step to remove the residual material on the metal layer, the contact resistance of the contact portions including IZO and the metal of aluminum-based material may be minimized and a reliable contact portion including the pad portions may be obtained. Furthermore, by forming the wire of aluminum and aluminum alloy, the characteristics of display device may be improved in large scale LCDs, and by simplifying the manufacturing process, manufacturing costs may also be minimized.

In the drawings and specification, there have been disclosed typical preferred embodiments of the present invention and, although specific terms are employed, they are used in a generic and descriptive sense only and not for purposes of limitation, the scope of the invention being set forth in the following claims.

What is claimed is:

1. A thin film transistor (TFT) array panel, comprising:
   a gate wire formed on an insulating substrate;
   a gate insulating layer covering the gate wire;
   a semiconductor layer formed on the gate insulating layer;
   a data wire formed on the gate insulating layer and the semiconductor layer;
   a passivation layer covering the data wire; and
   a transparent conductive layer formed of indium zinc oxide (IZO),
   wherein at least one of the gate wire and the data wire is formed of a conductive layer containing aluminum, and the transparent conductive layer is connected to and in direct contact with the conductive layer.

2. The TFT array panel of claim 1, wherein the data wire has a flat surface.

3. The TFT array panel of claim 1, wherein the insulating layer and the passivation layer are made of silicon-nitride.

4. The TFT array panel of claim 1, wherein the gate wire includes a gate line, a gate electrode connected to the gate line, and a gate pad connected to the gate line, and
   the data wire includes a data line, a source electrode connected to the data line, a drain electrode separated from the source electrode and opposite to the source electrode with respect to the gate electrode, and a data pad connected to the data line.

5. The TFT array panel of claim 4, wherein the passivation layer further comprises a second contact hole exposing the data pad and a third contact hole exposing the gate pad along with the gate insulating layer, the first to the third contact holes have a shape including rounds or corner, and a size of the first to the third contact holes are greater than 4 μm*4 μm.

6. The TFT array panel of claim 1, wherein the conductive layer is formed of aluminum or an aluminum alloy.

7. The TFT array panel of claim 6, wherein the transparent conductive layer comprises:
   a first pattern directly contacting and connected to the gate wire through the gate insulating layer, and
   a second pattern directly contacting and connected to the data wire through the passivation layer.

8. A thin film transistor (TFT) array panel, comprising:
   a substrate;
   a gate wire formed on the substrate and comprising a gate pad and a gate line extended from the gate pad;
   a gate insulating layer covering the gate wire;
   a data wire formed on the gate insulating layer and comprising a data line, a source electrode connected to the data line and a drain electrode separated from the source electrode;
   a passivation layer covering the data wire; and
   a transparent conductive layer formed of indium zinc oxide (IZO),
   wherein at least one of the gate pad and the drain electrode is formed of a conductive layer containing aluminum, and the transparent conductive layer is connected to and in direct contact with the conductive layer.

9. The TFT array panel of claim 8, wherein the conductive layer is formed of aluminum or an aluminum alloy.

10. The TFT array panel of claim 9, wherein the conductive layer is formed of an Al—Nd alloy.

11. The TFT array panel of claim 8, wherein the passivation layer is formed of silicon nitride.

12. The TFT array panel of claim 8, wherein the transparent conductive layer formed of IZO is formed from an IZO target including $In_2O_3$ and ZnO with a Zn content ranged between 15% to 20%.

13. The TFT array panel of claim 1, wherein the transparent conductive layer formed of IZO is formed from an IZO target including $In_2O_3$ and ZnO with a Zn content ranged between 15% to 20%.

14. The TFT array panel of claim 6, wherein the conductive layer is formed of an Al—Nd alloy.

* * * * *